(12) United States Patent
Yokoyama et al.

(10) Patent No.: US 12,387,941 B2
(45) Date of Patent: *Aug. 12, 2025

(54) ETCHING METHOD AND PLASMA PROCESSING APPARATUS

(71) Applicant: Tokyo Electron Limited, Tokyo (JP)

(72) Inventors: Takahiro Yokoyama, Miyagi (JP); Maju Tomura, Miyagi (JP); Yoshihide Kihara, Miyagi (JP); Satoshi Ohuchida, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 369 days.

This patent is subject to a terminal disclaimer.

(21) Appl. No.: 17/852,395

(22) Filed: Jun. 29, 2022

(65) Prior Publication Data

US 2022/0328323 A1  Oct. 13, 2022

Related U.S. Application Data

(63) Continuation of application No. 17/090,964, filed on Nov. 6, 2020, now Pat. No. 11,417,535.

(30) Foreign Application Priority Data

Nov. 8, 2019 (JP) .................................. 2019-203326
Sep. 3, 2020 (JP) .................................. 2020-148214

(51) Int. Cl.
*H01L 21/311* (2006.01)
*H01J 37/20* (2006.01)
(Continued)

(52) U.S. Cl.
CPC ........ *H01L 21/31116* (2013.01); *H01J 37/20* (2013.01); *H01J 37/32082* (2013.01);
(Continued)

(58) Field of Classification Search
CPC .......... H01L 21/00–86; H01J 37/00–36; H01J 2337/00–339
See application file for complete search history.

(56) References Cited

U.S. PATENT DOCUMENTS 6,635,185 B2    10/2003    Demmin et al.
6,927,173 B2     8/2005    Mori et al.
(Continued)

FOREIGN PATENT DOCUMENTS

CN    109075075 A    12/2018
CN    110246760 A     9/2019
(Continued)

OTHER PUBLICATIONS

Korean Request for the Submission of an Opinion issued Nov. 19, 2023, in corresponding Korean Patent Application No. 10-2022-7016762, 9 pages.
(Continued)

*Primary Examiner* — Joshua L Allen
*Assistant Examiner* — Andrew Keelan Laobak
(74) *Attorney, Agent, or Firm* — XSENSUS LLP

(57) ABSTRACT

A technique protects a mask in plasma etching of a silicon-containing film. An etching method includes providing a substrate in a chamber included in a plasma processing apparatus. The substrate includes a silicon-containing film and a mask. The mask contains carbon. The etching method further includes etching the silicon-containing film with a chemical species in plasma generated from a process gas in the chamber. The process gas contains a halogen and phosphorus. The etching includes forming a carbon-phosphorus bond on a surface of the mask.

19 Claims, 18 Drawing Sheets

(51) Int. Cl.
*H01J 37/32* (2006.01)
*H01L 21/3065* (2006.01)

(52) U.S. Cl.
CPC .... *H01J 37/32449* (2013.01); *H01L 21/3065* (2013.01); *H01L 21/31144* (2013.01); *H01J 2237/334* (2013.01)

(56) References Cited

U.S. PATENT DOCUMENTS

| | | | |
|---|---|---|---|
| 7,951,683 | B1 | 5/2011 | Shanker |
| 8,440,572 | B2 | 5/2013 | Honda |
| 10,453,684 | B1 | 10/2019 | Zhang et al. |
| 10,741,406 | B2 | 8/2020 | Domori et al. |
| 10,861,693 | B2 | 12/2020 | Stone et al. |
| 2003/0098288 | A1 | 5/2003 | Mori et al. |
| 2006/0073706 | A1 | 4/2006 | Li et al. |
| 2010/0093178 | A1* | 4/2010 | Honda ............... H01J 37/3244 438/719 |
| 2011/0070665 | A1 | 3/2011 | Chen et al. |
| 2011/0312180 | A1 | 12/2011 | Wang |
| 2013/0323932 | A1 | 12/2013 | Guha |
| 2014/0248718 | A1 | 9/2014 | Kim et al. |
| 2015/0214474 | A1 | 7/2015 | Nishimura et al. |
| 2015/0235862 | A1 | 8/2015 | Takahashi et al. |
| 2016/0343580 | A1 | 11/2016 | Hudson |
| 2017/0076945 | A1* | 3/2017 | Hudson ............... H01J 37/3244 |
| 2017/0133233 | A1 | 5/2017 | Sato et al. |
| 2017/0222139 | A1 | 8/2017 | Nishimura et al. |
| 2017/0330759 | A1 | 11/2017 | Gohira et al. |
| 2017/0338119 | A1 | 11/2017 | Zhang et al. |
| 2018/0233356 | A1 | 8/2018 | Han et al. |
| 2018/0366336 | A1 | 12/2018 | Shen et al. |
| 2019/0131140 | A1 | 5/2019 | Sun et al. |
| 2019/0185996 | A1 | 6/2019 | Jha et al. |

FOREIGN PATENT DOCUMENTS

| | | |
|---|---|---|
| JP | 7-147273 A | 6/1995 |
| JP | 8-181116 A | 7/1996 |
| JP | 2010-98040 A | 4/2010 |
| WO | WO-2019217463 A1 * 11/2019 ....... C23C 16/45536 |

OTHER PUBLICATIONS

U.S. Office Action issued Apr. 27, 2022 in U.S. Appl. No. 17/666,570.
European Extended Search Report issued Nov. 9, 2023, in corresponding European Patent Application No. 20883813.6, 8 pages.

* cited by examiner

ETCHING METHOD AND PLASMA PROCESSING APPARATUS

CROSS-REFERENCE TO RELATED APPLICATIONS

This application is a continuation application of U.S. application Ser. No. 17/090,964, filed on Nov. 6, 2020, which claims priority to Japanese Patent Application Nos. 2019-203326 filed on Nov. 8, 2019 and 2020-148214 filed on Sep. 3, 2020, the entire disclosures of each of which are incorporated herein by reference. This application is related to U.S. application Ser. No. 16/930,483, filed Jul. 16, 2020, which is a Bypass Continuation-in-Part of PCT/JP/2020/005847 filed 14 Feb. 2020.

BACKGROUND

Technical Field

Exemplary embodiments of the present disclosure relate to an etching method and a plasma processing apparatus.

Description of the Background

Manufacturing electronic devices includes plasma etching of silicon-containing films on substrates. Plasma etching of silicon-containing films uses process gases containing fluorocarbon gases. Such plasma etching is described in Patent Literature 1.

CITATION LIST

Patent Literature

Patent Literature 1: U.S. Patent Application Publication No. 2016/0343580

BRIEF SUMMARY

The present disclosure is directed to a technique for protecting a substrate during plasma etching of a silicon-containing film.

An etching method according to an exemplary embodiment includes providing a substrate in a chamber included in a plasma processing apparatus. The substrate includes a silicon-containing film and a mask. The mask contains carbon. The etching method further includes etching the silicon-containing film with a plasma generated from a process gas supplied to the chamber. The process gas contains a halogen component and a phosphorus component. The etching includes forming a carbon-phosphorus bond on a surface of the mask.

The technique according to an exemplary embodiment protects a substrate during plasma etching of a silicon-containing film.

DETAILED DESCRIPTION

Figure 1:
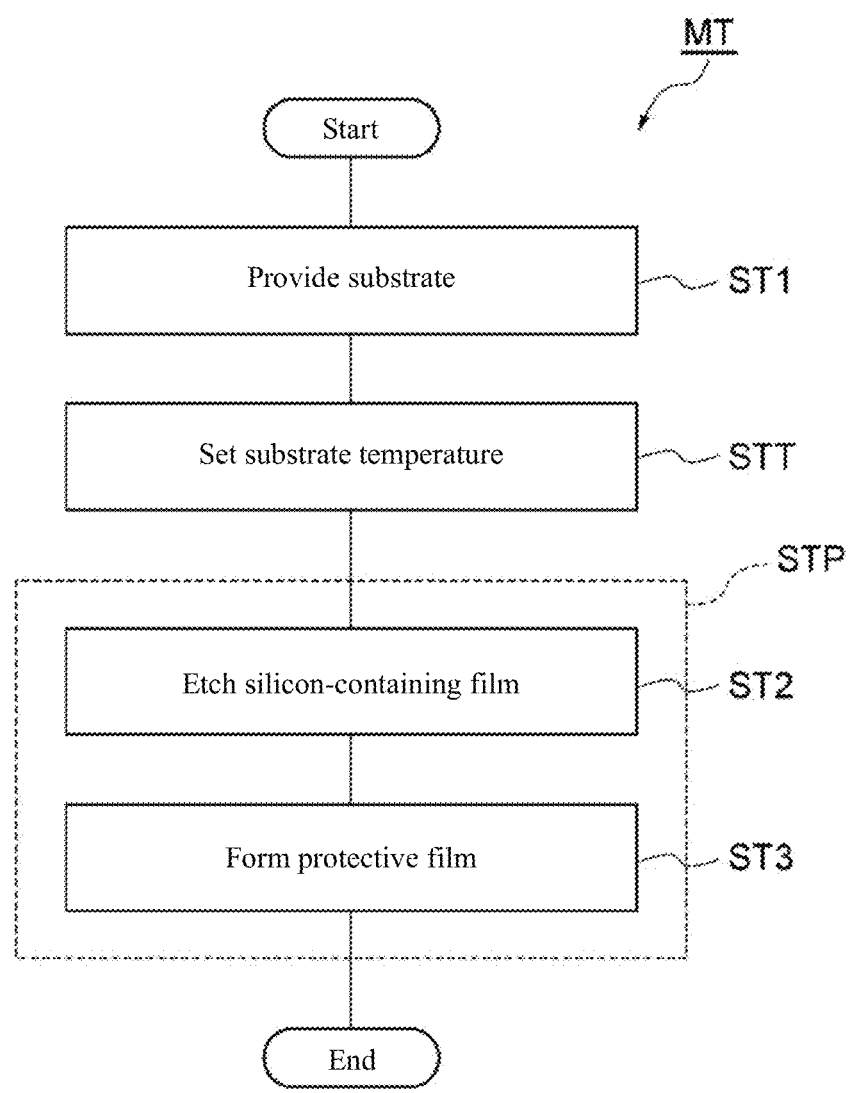
FIG. 1 is a flowchart of an etching method according to an exemplary embodiment.

Exemplary embodiments will now be described.

An etching method according to one exemplary embodiment includes providing a substrate in a chamber included in a plasma processing apparatus. The substrate includes a silicon-containing film and a mask. The mask contains carbon. The etching method further includes etching the silicon-containing film with a plasma generated from a process gas supplied to the chamber. The process gas contains a halogen component and a phosphorus component. The etching includes forming a carbon-phosphorus bond on a surface of the mask. The halogen component of the process gas may be fluorine.

With the etching method according to the above embodiment, a carbon-phosphorus bond is formed on the surface of a mask with higher bond energy than a carbon-carbon bond in the mask. The etching method according to the above embodiment thus protects a mask during plasma etching of a silicon-containing film. The technique according to the above embodiment thus protects a substrate during plasma etching of a silicon-containing film. The etching method according to the above embodiment also reduces failures in the features of a mask in plasma etching of a silicon-containing film.

In one exemplary embodiment, the silicon-containing film may include a silicon oxide film. The silicon-containing film may further include at least one selected from the group consisting of a silicon nitride film, a polycrystalline silicon film, a carbon-containing silicon film, and a low dielectric constant film.

In one exemplary embodiment, the mask may include a first portion with a higher proportion of mask material than openings defined in the mask on the silicon-containing film and a second portion with a lower proportion of mask material than the openings. The first portion with the higher proportion of mask material than the openings refers to a mask portion containing more mask material (hereinafter referred to as a higher density region), and the second portion with the lower proportion of mask material than the openings refers to a mask portion containing less mask material (hereinafter referred to as a lower density region). In the present embodiment, the mask is protected by a carbon-phosphorus bond on its surface and thus undergoes less etching in its lower density region. The mask is etched by amounts with a reduced difference between its lower density region and its higher density region. This reduces failures in the features of the mask including a lower density region and a higher density region.

In one exemplary embodiment, the etching method may further include forming a protective film on a surface of a side wall defining a recess formed by the etching. The protective film contains the phosphorus from the phosphorous component of the process gas. The etching and forming may be performed at the same time. The protective film may contain at least one of a phosphorus-oxygen bond or a phosphorus-silicon bond.

In one exemplary embodiment, the process gas may contain a fluorine-containing gas and a phosphorus-containing gas.

In one exemplary embodiment, the process gas may contain at least one phosphorus-containing molecule (or compound) selected from the group consisting of $PF_3$, $PCl_3$, $PF_5$, $PCl_5$, $POCl_3$, $PH_3$, $PBr_3$, and $PBr_5$.

In one exemplary embodiment, the process gas may further contain a hydrocarbon, a hydrofluorocarbon, or a fluorocarbon.

In one exemplary embodiment, the etching may include periodically applying a pulse wave including a pulsed electrical bias to a lower electrode in a substrate support that supports the substrate. The pulse wave may have a period defined by a frequency ranging from 1 Hz to 100 kHz inclusive. The pulsed electrical bias may be applied to the lower electrode for a duration ranging from 50% to 99% inclusive of a length of a period of the pulse wave. The pulsed electrical bias may include radio-frequency power at a power level of 2 kW or more.

In one exemplary embodiment, the substrate may be set to a temperature lower than or equal to 0° C. at a start of the etching.

A plasma processing apparatus according to another exemplary embodiment includes a chamber, a substrate support, a gas supply unit (or controllable gas supply, or controllable gas supply source), and a plasma generator. The substrate support supports a substrate in the chamber. The substrate includes a silicon-containing film and a mask. The mask contains carbon. The gas supply unit supplies, into the chamber, a process gas for etching the silicon-containing film. The process gas contains a halogen component and a phosphorus component. The plasma generator generates plasma from the process gas in the chamber to etch the silicon-containing film and form a carbon-phosphorus bond on a surface of the mask. The halogen may be fluorine.

An etching method according to still another exemplary embodiment includes providing a substrate in a chamber of a plasma processing apparatus. The substrate includes a silicon-containing film and a mask on the silicon-containing film, the silicon-containing film having a recess with a side wall. The etching method further includes inactivating a surface of the side wall with a phosphorus component of a process gas received on the substrate. The etching method further includes etching the silicon-containing film with a halogen component of the process gas received on the substrate.

With the etching method according to the above embodiment, the side wall surface of a silicon-containing film is inactivated (or passivated) by phosphorus. The side wall surface is thus passivated. The etching method according to the above embodiment enables plasma etching of the silicon-containing film with reduced lateral etching by protecting the side wall surface. The etching method according to the above embodiment thus protects the substrate in plasma etching of the silicon-containing film.

In one exemplary embodiment, the mask may contain carbon. In the inactivating, a carbon-phosphorus bond may be formed on the surface of the mask.

In one exemplary embodiment, the silicon-containing film may include a silicon oxide film, and a phosphorus-oxygen bond may be formed on the side wall surface in the inactivating.

In one exemplary embodiment, the inactivating and etching may be performed at the same time.

In one exemplary embodiment, the inactivating and etching may be repeated. The inactivating and etching may be repeated alternately.

In one exemplary embodiment, the inactivating and etching may be performed with a substrate placed in the chamber included in the plasma processing apparatus.

In one exemplary embodiment, the phosphorus chemical species may be produced by generating plasma from a phosphorus-containing gas, and the halogen component may be produced from plasma generated from a halogen-containing gas.

In one exemplary embodiment, the halogen-containing gas may contain a fluorine-containing gas. In one exemplary embodiment, the fluorine-containing gas may contain at least one of hydrogen fluoride, iodine fluoride, or a fluorocarbon.

In one exemplary embodiment, the phosphorus-containing gas may not contain fluorine. In one exemplary embodiment, the phosphorus-containing gas may contain $PCl_3$ or $POCl_3$.

A plasma processing apparatus according to still another exemplary embodiment includes a chamber, a substrate support, a controllable gas supply, a plasma generator, and a controller. The substrate support supports a substrate in the chamber. The substrate includes a silicon-containing film and a mask on the silicon-containing film. The controllable gas supply supplies a phosphorus-containing gas and a halogen-containing gas into the chamber. The plasma generator generates plasma from gas supplied to the chamber. The controller controls the controllable gas supply and the plasma generator. The controller also controls the controllable gas supply and the plasma generator to supply a phosphorus-containing gas into the chamber and generate plasma from the phosphorus-containing gas to produce a phosphorus chemical species that inactivates the surface of a side wall defining a recess in a silicon-containing film. The controller controls the controllable gas supply and the plasma generator to supply a halogen-containing gas into the chamber and generate plasma from the halogen-containing gas to produce a halogen chemical species for etching a silicon-containing film.

An etching method according to still another embodiment includes step a of providing a substrate in a chamber included in a plasma processing apparatus. The substrate includes a silicon-containing film. The etching method further includes a step of etching the silicon-containing film with a chemical species (or process gas component) in plasma generated from a process gas in the chamber. The process gas contains a halogen and phosphorus.

In the above embodiment, a recess is formed in the silicon-containing film by etching, and a protective film containing silicon and the phosphorus contained in the process gas is formed on the surface of a side wall defining the recess. The protective film protects the side wall surface while the silicon-containing film is being etched. This method enables plasma etching of the silicon-containing film with reduced lateral etching.

The etching method according to one exemplary embodiment may further include a step of forming a protective film on the surface of a side wall defining a recess formed by the etching the silicon-containing film. The protective film contains the phosphorus contained in the process gas. The etching the silicon-containing film and the forming the protective film may be performed at the same time.

In one exemplary embodiment, the process gas may contain at least one phosphorus-containing molecule selected from the group consisting of $PF_3$, $PCl_3$, $PF_5$, $PCl_5$, $POCl_3$, $PH_3$, $PBr_3$, and $PBr_5$.

In one exemplary embodiment, the process gas may further contain carbon and hydrogen.

In one exemplary embodiment, the process gas may contain at least one hydrogen-containing molecule selected from the group consisting of $H_2$, HF, $C_xH_y$, $C_sH_tF_u$, and $NH_3$, where x, y, s, t, and u are natural numbers.

In one exemplary embodiment, the halogen may be fluorine.

In one exemplary embodiment, the process gas may further contain oxygen.

In one exemplary embodiment, the silicon-containing film may be a silicon-containing dielectric film.

In one exemplary embodiment, the silicon-containing film may include at least one selected from the group consisting of a silicon oxide film, a silicon nitride film, and a silicon film.

In one exemplary embodiment, the silicon-containing film may include at least two silicon-containing films with different compositions.

In one exemplary embodiment, the at least two silicon-containing films may include a silicon oxide film and a silicon nitride film. In some exemplary embodiments, the at least two silicon-containing films may include a silicon oxide film and a silicon film. In some exemplary embodiments, the at least two silicon-containing films may include a silicon oxide film, a silicon nitride film, and a silicon film.

In one exemplary embodiment, the substrate may further include a mask on the silicon-containing film.

In one exemplary embodiment, the substrate may be set to a temperature lower than or equal to 0° C. at the start of the etching the silicon-containing film.

A plasma processing apparatus according to still another exemplary embodiment includes a chamber, a substrate support, a controllable gas supply, and a radio-frequency (RF) power supply. The substrate support supports a substrate in the chamber. The controllable gas supply supplies, into the chamber, a process gas used to etch a silicon-containing film. The process gas contains a halogen component and a phosphorus component. The RF power supply generates radio-frequency power usable to generate plasma from the process gas in the chamber.

Exemplary embodiments will now be described in detail with reference to the drawings. In the drawings, similar or corresponding components are indicated by like reference numerals. The embodiments are illustrated by way of example and not by way of limitation in the accompanying drawings that are not to scale unless otherwise indicated.

FIG. 1 is a flowchart of an etching method according to an exemplary embodiment. The etching method shown in FIG. 1 (hereinafter referred to as the method "MT") is used for a substrate including a silicon-containing film. The silicon-containing film is etched with the method MT.

Figure 2:
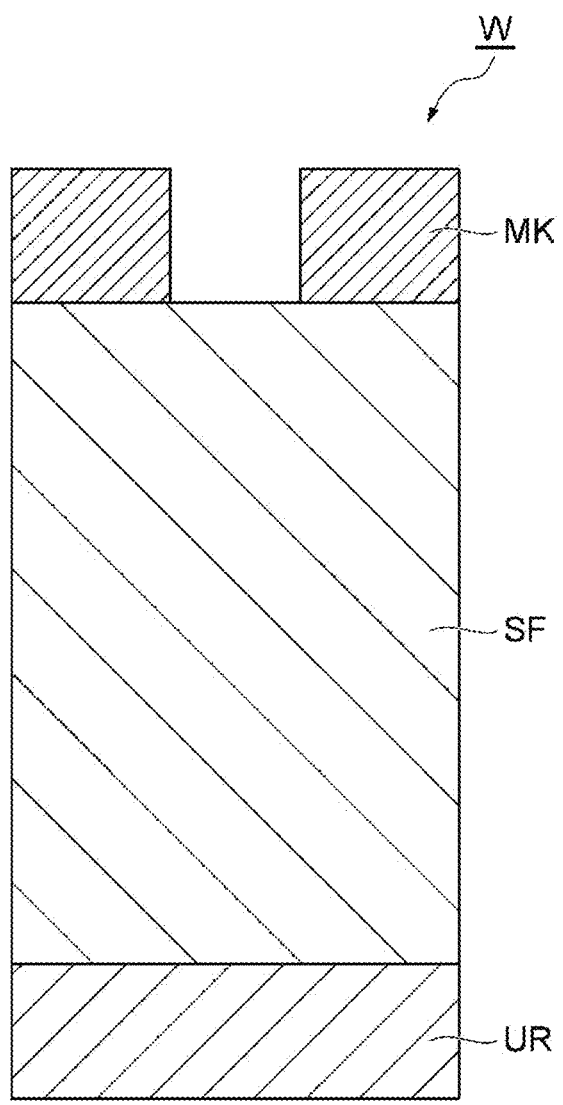
FIG. 2 is a partially enlarged cross-sectional view of an exemplary substrate to be processed with the etching method shown in FIG. 1.

FIG. 2 is a partially enlarged cross-sectional view of an exemplary substrate W to be processed with the etching method shown in FIG. 1. The substrate W shown in FIG. 2 can be used for manufacturing devices such as a dynamic random-access memory (DRAM) and a 3D-NAND. The substrate W includes a silicon-containing film SF. The substrate W may further include an underlying region UR. The silicon-containing film SF may be located on the underlying region UR. The silicon-containing film SF may be a silicon-containing dielectric film. The silicon-containing dielectric film may include a silicon oxide film or a silicon nitride film. The silicon-containing dielectric film may be any other silicon-containing film with a different composition. The silicon-containing film SF may include a silicon film (e.g., a polycrystalline silicon film). The silicon-containing film SF may include at least one selected from the group consisting of a silicon nitride film, a polycrystalline silicon film, a carbon-containing silicon film, and a low dielectric constant film. The carbon-containing silicon film may include at least one of a SiC film or a SiOC film. The low dielectric constant film may contain silicon and serve as an interlayer insulating film. As an alternative to a single film, the silicon-containing film SF may include two or more silicon-containing films with different compositions. The two or more silicon-containing films may include a silicon oxide film and a silicon nitride film. The silicon-containing film SF may be, for example, a multilayer including an alternate stack of one or more silicon oxide films and one or more silicon nitride films. The silicon-containing film SF may be a multilayer including an alternate stack of multiple silicon oxide films and multiple silicon nitride films. In some exemplary embodiments, the two or more silicon-containing films may include a silicon oxide film and a silicon film. The silicon-containing film SF may be, for example, a multilayer including an alternate stack of one or more silicon oxide films and one or more silicon films. The silicon-containing film SF may be a multilayer including an alternate stack of multiple silicon oxide films and multiple polycrystalline silicon films. In some exemplary embodiments, the at least two silicon-containing films may include a silicon oxide film, a silicon nitride film, and a silicon film.

The substrate W may further include a mask MK. The mask MK is located on the silicon-containing film SF. The mask MK is formed from a material having a lower etching rate than the silicon-containing film SF in step ST2. The mask MK may be formed from an organic material. More specifically, the mask MK may contain carbon. The mask MK may be formed from, for example, an amorphous carbon film, a photoresist film, or a spin-on-carbon (SOC) film. In some exemplary embodiments, the mask MK may be formed from a silicon-containing film such as a silicon-containing antireflective film. In some exemplary embodiments, the mask MK may be a metal-containing mask formed from a metal-containing material, such as titanium nitride, tungsten, or tungsten carbide. The mask MK may have a thickness of 3 μm or more.

The mask MK is patterned. More specifically, the mask MK has a pattern to be transferred onto the silicon-containing film SF in step ST2. With the pattern of the mask MK transferred onto the silicon-containing film SF, the silicon-containing film SF can have a recess such as a hole or a trench, with sidewall(s). The recess in the silicon-containing film SF in step ST2 may have an aspect ratio of 20 or more, or 30, 40, or 50 or more. The mask MK may have a line-and-space pattern.

Figure 3:
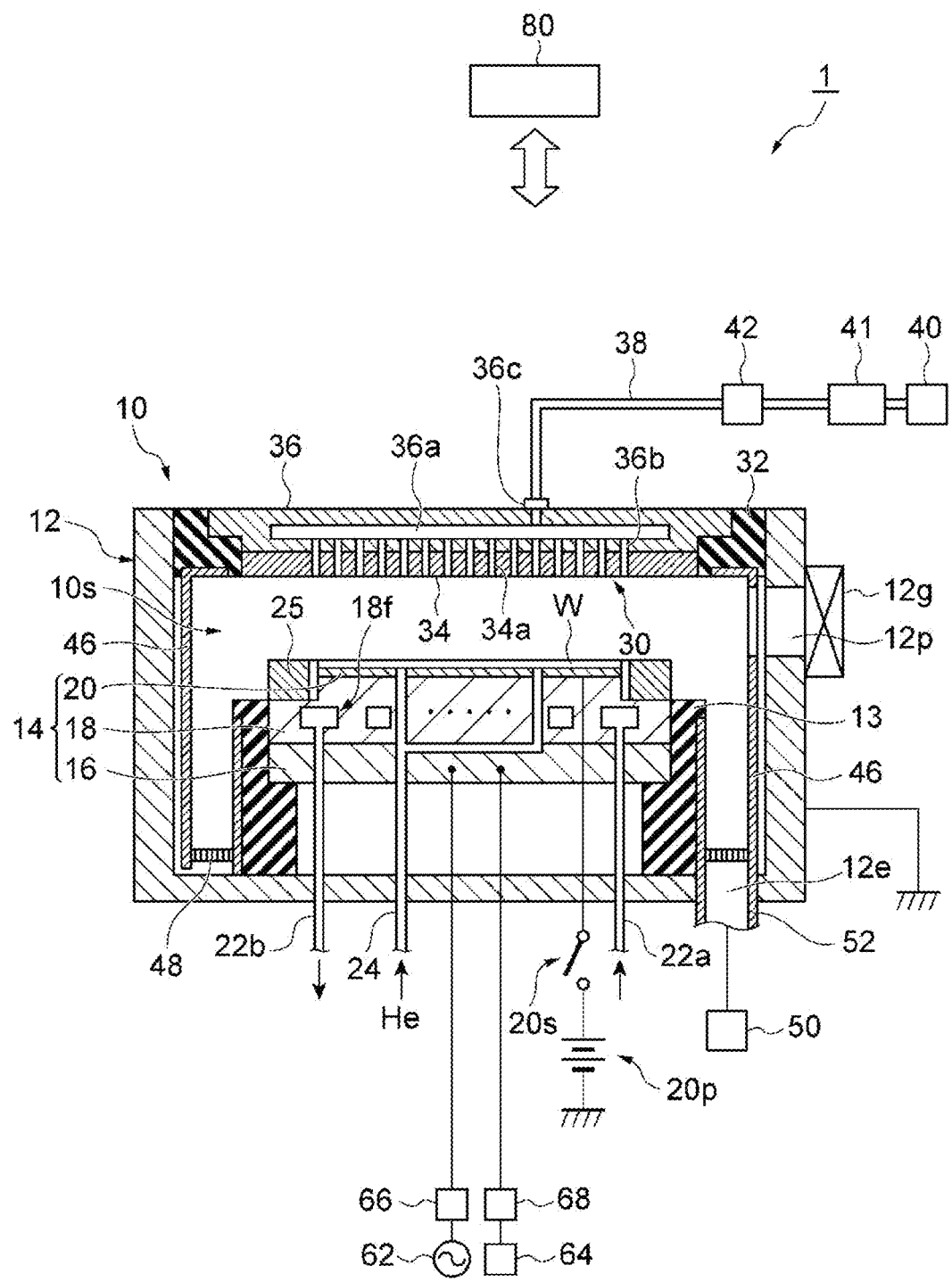
FIG. 3 is a schematic diagram of a plasma processing apparatus according to an exemplary embodiment.

The method MT is used by a plasma processing apparatus for etching the silicon-containing film SF. FIG. 3 is a schematic diagram of a plasma processing apparatus according to an exemplary embodiment. A plasma processing apparatus 1 shown in FIG. 3 includes a chamber 10 with an internal space 10s. The chamber 10 includes a chamber body 12, which is substantially cylindrical. The chamber body 12 is formed from, for example, aluminum. The chamber body 12 has an inner wall coated with an anticorrosive film, which may be formed from ceramic such as aluminum oxide or yttrium oxide.

The chamber body 12 has a side wall having a port 12p. The substrate W is transferred between the internal space 10s and the outside of the chamber 10 through the port 12p. The port 12p is open and closed by a gate valve 12g on the side wall of the chamber body 12.

A support 13 is located on the bottom of the chamber body 12. The support 13 is substantially cylindrical and is formed from an insulating material. The support 13 extends upward from the bottom of the chamber body 12 into the internal space 10s. The support 13 supports a substrate support 14. The substrate support 14 supports the substrate W in the internal space 10s.

The substrate support 14 includes a lower electrode 18 and an electrostatic chuck (ESC) 20. The substrate support 14 may further include an electrode plate 16. The electrode plate 16 is substantially disk-shaped and is formed from a conductor such as aluminum. The lower electrode 18 is on the electrode plate 16. The lower electrode 18 is substantially disk-shaped and is formed from a conductor such as aluminum. The lower electrode 18 is electrically coupled to the electrode plate 16.

The ESC 20 is on the lower electrode 18. The substrate W is placed on an upper surface of the ESC 20. The ESC 20 includes a body and an electrode. The body of the ESC 20 is substantially disk-shaped and is formed from a dielectric. In the ESC 20, the electrode is a film electrode located in the body. The electrode in the ESC 20 is coupled to a direct-current (DC) power supply 20p via a switch 20s. A voltage is applied from the DC power supply 20p to the electrode in the ESC 20 to generate an electrostatic attraction between the ESC 20 and the substrate W. The substrate W is attracted to and held by the ESC 20 under the generated electrostatic attraction.

An edge ring 25 is placed on the substrate support 14. The edge ring 25 is annular and may be formed from silicon, silicon carbide, or quartz. The substrate W is placed in an area on the ESC 20 surrounded by the edge ring 25.

The lower electrode 18 has an internal channel 18f for carrying a heat-exchange medium (e.g., refrigerant) being supplied through a pipe 22a from a chiller unit external to the chamber 10. The heat-exchange medium being supplied to the channel 18f returns to the chiller unit through a pipe 22b. In the plasma processing apparatus 1, the temperature of the substrate W on the ESC 20 is adjusted through heat exchange between the heat-exchange medium and the lower electrode 18.

The plasma processing apparatus 1 includes a gas supply line 24. The gas supply line 24 supplies a heat-transfer gas (e.g., He gas) from a heat-transfer gas supply assembly to a space between the upper surface of the ESC 20 and a back surface of the substrate W.

The plasma processing apparatus 1 further includes an upper electrode 30. The upper electrode 30 is located above the substrate support 14. The upper electrode 30 is supported on an upper portion of the chamber body 12 with a member 32, which is formed from an insulating material. The upper electrode 30 and the member 32 close a top opening of the chamber body 12.

The upper electrode 30 may include a ceiling plate 34 and a support member 36. The ceiling plate 34 has its lower surface exposed to and defining the internal space 10s. The ceiling plate 34 is formed from a low resistance conductor or a semiconductor that generates less Joule heat. The ceiling plate 34 has multiple gas outlet holes 34a that are through-holes in the thickness direction.

The support member 36 supports the ceiling plate 34 in a detachable manner. The support member 36 is formed from a conductive material such as aluminum. The support member 36 has an internal gas-diffusion compartment 36a. The support member 36 has multiple gas holes 36b that extend downward from the gas-diffusion compartment 36a. The gas holes 36b communicate with the respective gas outlet holes 34a. The support member 36 has a gas inlet 36c that connects to the gas-diffusion compartment 36a and to a gas supply pipe 38.

The gas supply pipe 38 is connected to a set of gas sources 40 via a set of flow controllers 41 and a set of valves 42. The flow controller set 41 and the valve set 42 form a gas supply unit. The gas supply unit may further include the gas source set 40. The gas source set 40 includes multiple gas sources. The gas sources include the sources of the process gas used with the method MT. The flow controller set 41 includes multiple flow controllers. The flow controllers in the flow controller set 41 are mass flow controllers or pressure-based flow controllers. The valve set 42 includes multiple open-close valves. The gas sources in the gas source set 40 are connected to the gas supply pipe 38 via the respective flow controllers in the flow controller set 41 and via the respective open-close valves in the valve set 42.

The plasma processing apparatus 1 includes a shield 46 along the inner wall of the chamber body 12 and along the periphery of the support 13 in a detachable manner. The shield 46 prevents a reaction product from accumulating on the chamber body 12. The shield 46 includes, for example, an aluminum base coated with an anticorrosive film, which may be formed from ceramic such as yttrium oxide.

A baffle plate 48 is located between the support 13 and the side wall of the chamber body 12. The baffle plate 48 includes, for example, an aluminum member coated with an anticorrosive film (e.g., yttrium oxide film). The baffle plate 48 has multiple through-holes. The chamber body 12 has an outlet 12e in its bottom below the baffle plate 48. The outlet 12e is connected to an exhaust device 50 through an exhaust pipe 52. The exhaust device 50 includes a pressure control valve and a vacuum pump such as a turbomolecular pump.

The plasma processing apparatus 1 includes an RF power supply 62 and a bias power supply 64. The RF power supply 62 generates RF power HF. The RF power HF has a first frequency suitable for generating plasma. The first frequency ranges from, for example, 27 to 100 MHz. The RF power supply 62 is coupled to the lower electrode 18 via an impedance matching circuit, or matcher 66, and the electrode plate 16. The matcher 66 includes a circuit for matching the impedance of a load (the lower electrode 18) for the RF power supply 62 and the output impedance of the RF power supply 62. The RF power supply 62 may be coupled to the upper electrode 30 via the matcher 66. The RF power supply 62 serves as an exemplary plasma generator.

The bias power supply 64 generates an electrical bias. The bias power supply 64 is electrically coupled to the lower electrode 18. The electrical bias has a second frequency that is lower than the first frequency. The second frequency ranges from, for example, 400 kHz to 13.56 MHz. When used in addition to the RF power HF, the electrical bias is applied to the lower electrode 18 to draw ions toward the substrate W. The electrical bias applied to the lower electrode 18 changes the potential of the substrate W on the substrate support 14 to change in periods defined by the second frequency.

In one embodiment, the electrical bias may be RF power LF with the second frequency. When used in addition to the RF power HF, the RF power LF serves as RF bias power for drawing ions toward the substrate W. The bias power supply 64 that generates RF power LF is coupled to the lower electrode 18 via an impedance matching circuit, or matcher 68, and the electrode plate 16. The matcher 68 includes a circuit for matching the impedance of a load (the lower electrode 18) for the bias power supply 64 and the output impedance of the bias power supply 64.

The RF power LF alone may be used to generate plasma, without the RF power HF being used. In other words, a single RF power may be used to generate plasma. In this case, the RF power LF may have a frequency higher than 13.56 MHz, or for example, 40 MHz. In this case, the plasma processing apparatus 1 may not include the RF power supply 62 and the matcher 66. The bias power supply 64 serves as an exemplary plasma generator.

In some embodiments, the electrical bias may be a pulsed DC voltage. The pulsed DC voltage occurs periodically and is applied to the lower electrode 18. The pulsed DC voltage occurs in periods defined by the second frequency. Each period of the pulsed DC voltage includes two periods. The DC voltage is negative in one of the two periods. The DC voltage has a higher level (a larger absolute value) in one period than in the other period. The DC voltage may be negative or positive in the other period. The DC voltage may have a level of zero in the other period. In this embodiment, the bias power supply 64 is coupled to the lower electrode 18 via a low-pass filter and via the electrode plate 16.

In one embodiment, the bias power supply 64 may apply a continuous-wave electrical bias to the lower electrode 18. In other words, the bias power supply 64 may continuously apply the electrical bias to the lower electrode 18. The continuous-wave electrical bias may be applied to the lower electrode 18 during the processing in step STP or step ST2 and step ST3 of the method MT.

In some embodiments, the bias power supply 64 may apply a pulsed electrical bias to the lower electrode 18. The pulsed electrical bias may be periodically applied to the lower electrode 18. The pulsed electrical bias occurs in periods defined by a third frequency that is lower than the second frequency. The third frequency ranges from, for example, 1 Hz to 200 kHz inclusive. In some embodiments, the third frequency may range from 5 Hz to 100 kHz inclusive.

Each period of the pulsed electrical bias includes two periods, or specifically, a period H and a period L. The electrical bias has a higher level (or a higher level of the pulsed electrical bias) in the period H than in the period L. In other words, the level of the electrical bias may be changed to apply a pulsed electrical bias to the lower electrode 18. The electrical bias may have a level higher than zero in the period L. In some embodiments, the electrical bias may have a level of zero in the period L. In other words, the pulsed electrical bias may be applied to the lower electrode 18 by repeatedly turning on and off the electrical bias provided to the lower electrode 18. The RF power LF used as the electrical bias has the same level as the power level of the RF power LF. The RF power LF used as the pulsed electrical bias has a level of 2 kW or more. The pulsed negative DC voltage used as the electrical bias has a level equivalent to the effective value of the absolute value of the negative DC voltage. The duty ratio of the pulsed electrical bias, or the ratio of the period H to the period of the pulsed electrical bias, ranges from, for example, 1 to 80% inclusive. In some embodiments, the duty ratio of the pulsed electrical bias may range from 5 to 50% inclusive or 50 to 99% inclusive. The pulsed electrical bias may be applied to the lower electrode 18 to perform steps ST2 and ST3 of the method MT.

In one embodiment, the RF power supply 62 may provide a continuous-wave RF power HF. In other words, the RF power supply 62 may continuously provide the RF power HF. The continuous-wave RF power HF may be provided during the processing in step STP or step ST2 and step ST3 of the method MT.

In some embodiments, the RF power supply 62 may provide pulsed-RF power HF. The pulsed-RF power HF may be provided periodically. The pulsed-RF power HF occurs in periods defined by a fourth frequency that is lower than the second frequency. In one embodiment, the fourth frequency is the same as the third frequency. Each period of the pulsed-RF power HF includes two periods, or specifically, a period H and a period L. The RF power HF has a higher power level in the period H than in the other period, or the period L. The RF power HF may have a power level higher than zero or a power level of zero in the period L.

The periods of the pulsed-RF power HF may be synchronized with the periods of the pulsed electrical bias. The periods H of the pulsed-RF power HF may be synchronized with the periods H of the pulsed electrical bias. In some embodiments, the periods H of the pulsed-RF power HF may not be synchronized with the periods H of the pulsed electrical bias. The periods H of the pulsed-RF power HF may be the same durations as or may be durations different from the periods H of the pulsed electrical bias.

The gas supply unit supplies a gas into the internal space 10s for plasma processing in the plasma processing apparatus 1. The RF power HF or the electrical bias or both are provided to form an RF electric field between the upper electrode 30 and the lower electrode 18. The resultant RF electric field generates plasma from the gas in the internal space 10s.

The plasma processing apparatus 1 may further include a controller 80, which may be implemented as the control circuitry 130, discussed later in reference to FIG. 18. The controller 80 may be a computer including a processor, a storage such as a memory, an input device, a display, and an input-output interface for signals. The controller 80 controls the components of the plasma processing apparatus 1. An operator can use the input device in the controller 80 to input a command or perform other operations for managing the plasma processing apparatus 1. The display in the controller 80 can display and visualize the operating state of the plasma processing apparatus 1. The storage stores control programs and recipe data. The control program is executed by the processor to perform the processing in the plasma processing apparatus 1. The processor executes the control program to control the components of the plasma processing apparatus 1 in accordance with the recipe data.

Referring back to FIG. 1, the method MT used by the plasma processing apparatus 1 to process the substrate W shown in FIG. 2 will now be described by way of example. The components of the plasma processing apparatus 1 are controlled by the controller 80 to allow the plasma processing apparatus 1 to implement the method MT. The control by the controller 80 over the components of the plasma processing apparatus 1 to implement the method MT will also be described below.

Figures 4A, 4B:
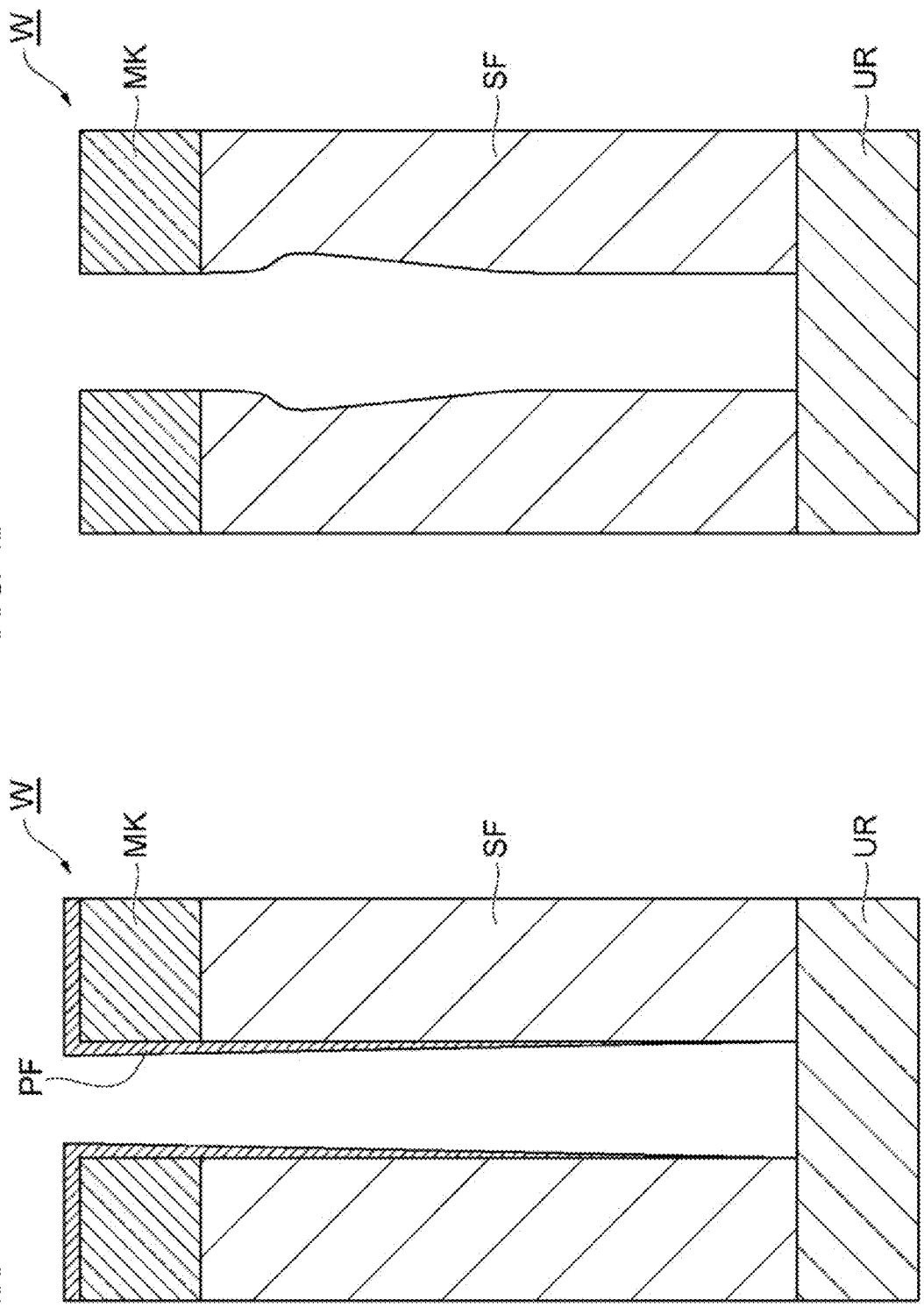
FIG. 4A is a partially enlarged cross-sectional view of an exemplary substrate processed with the etching method shown in FIG. 1.
FIG. 4B is a partially enlarged cross-sectional view of an exemplary substrate etched with plasma generated from a phosphorus-free process gas.
Figure 5:
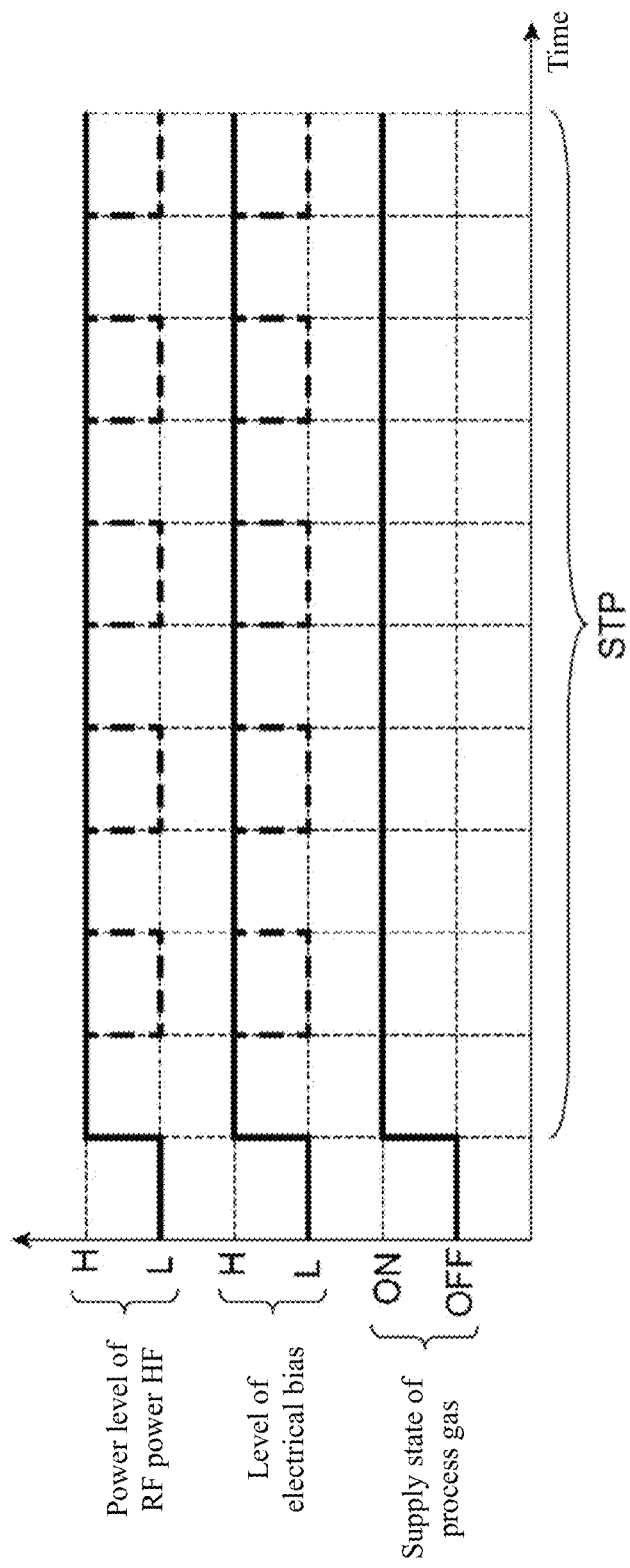
FIG. 5 is an exemplary timing chart of an etching method according to an exemplary embodiment.

FIGS. 4A, 4B, and 5 will now be referred to in addition to FIG. 1. FIG. 4A is a partially enlarged cross-sectional view of an exemplary substrate W processed with the etching method shown in FIG. 1. FIG. 4B is a partially enlarged cross-sectional view of an exemplary substrate etched with plasma generated from a phosphorus-free process gas. FIG. 5 is an exemplary timing chart of an etching method according to an exemplary embodiment. In FIG. 5, the horizontal axis indicates time, and the vertical axis indicates the power level of the RF power HF, the level of the electrical bias, and the supply state of the process gas. The RF power HF at L level indicates that the RF power HF is not being provided or is being provided at a power level lower than at the H level. The electrical bias at L level indicates that the electrical bias is not being applied to the lower electrode 18 or is being applied at a level lower than at the H level. The process gas in the ON supply state indicates that the process gas is being supplied into the chamber 10. The process gas in the OFF supply state indicates that its supply into the chamber 10 is stopped.

As shown in FIG. 1, the method MT starts from step ST1. In step ST1, the substrate W is provided in the chamber 10. The substrate W is placed onto and held by the ESC 20 in the chamber 10. The substrate W may have a diameter of 300 mm.

The method MT includes step STP to be performed next. The substrate W is processed with plasma in step STP. In step STP, plasma is generated from a process gas in the chamber 10. The method MT includes step ST2. Step ST2 is performed during step STP. The method MT may further include step ST3. Step ST3 is performed during step STP. Step ST2 may be performed at the same time as or independently from step ST3.

In step ST2, a silicon-containing film SF is etched with a chemical species in plasma generated from the process gas in the chamber 10 in step STP. Moreover, the process gas includes components a halogen component (or a part of the process gas) and a phosphorous component (or another part of the process gas), where plasma is generated from the process gas, as will be discussed. In this context the term species can refer to separate components of the process gas or combinations of the components of the process gas. In step ST3, a protective film PF is formed on the substrate W with a chemical species in plasma generated from the process gas in the chamber 10 in step STP. The protective film PF is formed on the surface of a side wall defining a recess in the silicon-containing film SF.

The process gas used in step STP contains a halogen component (i.e. a part of the process gas) and a phosphorus component (another part of the process gas). The halogen contained in the process gas may be fluorine. In other words, the process gas may contain a fluorine-containing gas. The process gas may contain at least one halogen-containing molecule (or more generally a halogen containing compound). The process gas may contain at least one halogen-containing molecule selected from the group consisting of a fluorocarbon and a hydrofluorocarbon. The fluorocarbon may be at least one of $CF_4$, $C_2F_6$, $C_3F_6$, $C_3F_8$, $C_4F_6$, $C_4F_8$, or $C_5F_8$. The hydrofluorocarbon may be at least one of $CH_2F_2$, $CHF_3$, or $CH_3F$.

The process gas may contain at least one phosphorus-containing molecule. In other words, the process gas may contain at least one phosphorus-containing gas. The phosphorus-containing gas may contain phosphorus and a halogen. The phosphorus-containing molecule may be an oxide such as tetraphosphorus decaoxide ($P_4O_{10}$), tetraphosphorus octoxide ($P_4O_8$), or tetraphosphorus hexaoxide ($P_4O_6$). Tetraphosphorus decaoxide may also be called diphosphorus pentaoxide ($P_2O_5$). The phosphorus-containing molecule may contain a phosphorus molecule and a halogen molecule. The phosphorus-containing molecule may be a halide such as phosphorus trifluoride ($PF_3$), phosphorus pentafluoride ($PF_5$), phosphorus trichloride ($PCl_3$), phosphorus pentachloride ($PCl_5$), phosphorus tribromide ($PBr_3$), phosphorus pentabromide ($PBr_5$), or phosphorus iodide ($PI_3$). The phosphorus-containing molecule may be a phosphoryl halide such as phosphoryl fluoride ($POF_3$), phosphorus oxychloride ($POCl_3$), or phosphoryl bromide ($POBr_3$). The phosphorus-containing molecule may be phosphine ($PH_3$), calcium phosphide (e.g., $Ca_3P_2$), phosphoric acid ($H_3PO_4$), sodium phosphate ($Na_3PO_4$), or hexafluorophosphoric acid ($HPF_6$). The phosphorus-containing molecule may be a fluorophosphine ($H_xPF_y$), where the sum of x and y is 3 or 5. The fluorophosphine ($H_xPF_y$) may be, for example, $HPF_2$ or $H_2PF_3$. The process gas may contain at least one phosphorus-containing molecule selected from the above phosphorus-containing molecules. For example, the process gas may contain at least one phosphorus-containing molecule selected from the group consisting of $PF_3$, $PCl_3$, $PF_5$, $PCl_5$, $POCl_3$, $PH_3$, $PBr_3$, and $PBr_5$. Each phosphorus-containing molecule contained in the process gas in either liquid or solid form may be vaporized by, for example, heating before being supplied into the chamber 10.

The process gas used in step ST2 may further contain carbon and hydrogen. The process gas may contain at least one hydrogen-containing molecule selected from the group consisting of $H_2$, hydrogen fluoride (HF), a hydrocarbon ($C_xH_y$), a hydrofluorocarbon ($C_sH_tF_u$), and $NH_3$. The hydrocarbon ($C_xH_y$) may be, for example, $CH_4$ or $C_3H_6$. The process gas may contain at least one carbon-containing molecule selected from the group consisting of the hydrocarbons ($C_xH_y$) listed above, the hydrofluorocarbons ($C_sH_tF_u$) listed above, and a fluorocarbon ($C_vF_w$), where x, y, s, t, u, v, and w are natural numbers. The process gas may further contain oxygen. The process gas may contain an oxygen-containing gas, for example, $O_2$. In some embodiments, the process gas may not contain oxygen.

In one embodiment, the process gas may contain a first gas and a second gas. The first gas contains no phosphorus. The first gas may contain a halogen. The first gas may contain a gas containing at least one halogen-containing molecule listed above. The first gas may further contain carbon and hydrogen. The first gas may further contain a gas containing the hydrogen-containing molecule listed above, a gas containing the carbon-containing molecule listed above, or both. The first gas may further contain oxygen. The first gas may contain an $O_2$ gas. In some embodiments, the first gas may not contain oxygen. The second gas contains phosphorus. The second gas may contain a gas containing at least one phosphorus-containing molecule listed above.

For the process gas used in step STP, the second gas may have the flow rate ratio, or the ratio of its flow rate to the flow rate of the first gas, set to a value larger than 0 and smaller than or equal to 0.5. The flow rate ratio may be set to a value of 0.075 to 0.3 inclusive. The flow rate ratio may be set to a value of 0.1 to 0.25 inclusive.

In step STP, the gas in the chamber 10 is set to a specified pressure. In step STP, the gas in the chamber 10 may be set to a pressure of 10 to 100 mTorr (1.3 to 13.3 Pa) inclusive. In step STP, the RF power HF is provided to generate plasma from the process gas in the chamber 10. As indicated by a solid line in FIG. 5, the continuous-wave RF power HF may be provided in step STP. In step STP, the RF power LF may be used instead of the RF power HF. In step STP, both the RF power HF and the electrical bias may be provided. As indicated by a solid line in FIG. 5, the continuous-wave electrical bias may be applied to the lower electrode 18 in step STP. The RF power HF may be set to a power level of 2 to 10 kW inclusive. The RF power LF may be set to a power level of 2 kW (a power level per unit area of the substrate W of 2.83 $W/cm^2$) or more. The RF power LF may be set to a power level of 10 kW (a power level per unit area of the substrate W of 14.2 $W/cm^2$) or more.

To perform the processing in step STP, the controller 80 controls the controllable gas supply to supply the process gas into the chamber 10. The controller 80 also controls the exhaust device 50 to maintain the chamber 10 at a specified gas pressure. The controller 80 also controls the plasma generator to generate plasma from the process gas. The controller 80 included in the plasma processing apparatus 1 controls the RF power supply 62 and the bias power supply 64 to provide the RF power HF, the RF power LF, or RF power HF and the electrical bias.

With the method MT according to one embodiment, the substrate W may be set to a temperature lower than or equal to 0° C. at the start of step ST2 (or step STP). At the set temperature of the substrate W, the silicon-containing film SF can be etched with a higher etching rate in step ST2. To set the temperature of the substrate W at the start of step ST2, the controller 80 may control the chiller unit. The substrate W may be set to a temperature lower than or equal to 200° C. during step ST2 (or step STP). At lower temperature (below 0 degree C., for example), side etch amount decreases according to Arrhenius rate law, which dictates that a rate of reaction increases with temperature. At lower temperatures, the volatility (a measure of a material's tendency to vaporize) of the protective layer (P—O) decreases. For low volatility (chemically strong), the effectiveness of the protective layer to protect against the sidewall from being laterally etched increases at lower temperature. Moreover, for high aspect etching, ion energy tends to be higher, and so the present inventor recognized the benefit for an etching temperature that should be lower to enhance the effectiveness of the protective layer. Therefore, in the context of this disclosure, a protective layer with lower volatility (achieved through controlling a temperature of the substrate W to remain low) is more desirable because it helps to suppress sidewall etching (bowing).

In one embodiment, the method MT may further include step STT, which is followed by step ST2 (or step STP). The substrate W is set to a temperature lower than or equal to 0° C. in step STT. The temperature of the substrate W at the start of step ST2 is set in step STT. To set the temperature of the substrate W in step STT, the controller 80 may control the chiller unit.

In step ST2, the silicon-containing film SF is etched with a halogen chemical species in plasma generated from the process gas. In one embodiment, a part of the silicon-containing film SF exposed from the mask MK is etched selectively (refer to FIG. 4A).

When the process gas contains a phosphorus-containing molecule containing phosphorus and a halogen, such as $PF_3$, the halogen chemical species from the molecule contributes to the etching of the silicon-containing film SF. The phosphorus-containing molecule containing phosphorus and a halogen, such as $PF_3$, thus increases the etching rate of the silicon-containing film SF in step ST2.

For the mask MK containing carbon, a carbon-phosphorus bond is formed on the surface of the mask MK in step ST2. The carbon-phosphorus bond on the surface of the mask MK has higher bond energy than a carbon-carbon bond in the mask MK. The method MT thus protects the mask MK in plasma etching of the silicon-containing film SF. The method MT also reduces failures in the features of the mask MK in plasma etching of the silicon-containing film SF. The method MT thus protects the substrate in plasma etching of a silicon-containing film.

In one embodiment, the method MT may further include step ST3 as shown in FIG. 1. In step ST3, the protective film PF is formed on the surface of a side wall defining a recess in the silicon-containing film SF that is formed by etching in step ST2 (refer to FIG. 4A). The protective film PF is formed with a chemical species in plasma generated from the process gas in the chamber 10 in step STP. In one embodiment, step ST3 may be performed at the same time as step ST2. In one embodiment, the protective film PF may have its thickness decreasing in the depth direction of the recess in the silicon-containing film SF as shown in FIG. 4A.

The protective film PF contains silicon and the phosphorus contained in the process gas used in step STP. In one embodiment, the protective film PF may further contain at least one of the carbon or hydrogen contained in the process gas. In one embodiment, the protective film PF may further contain the oxygen contained either in the process gas or in the silicon-containing film SF. In one embodiment, the protective film PF may contain a phosphorus-oxygen bond.

Figure 6A:
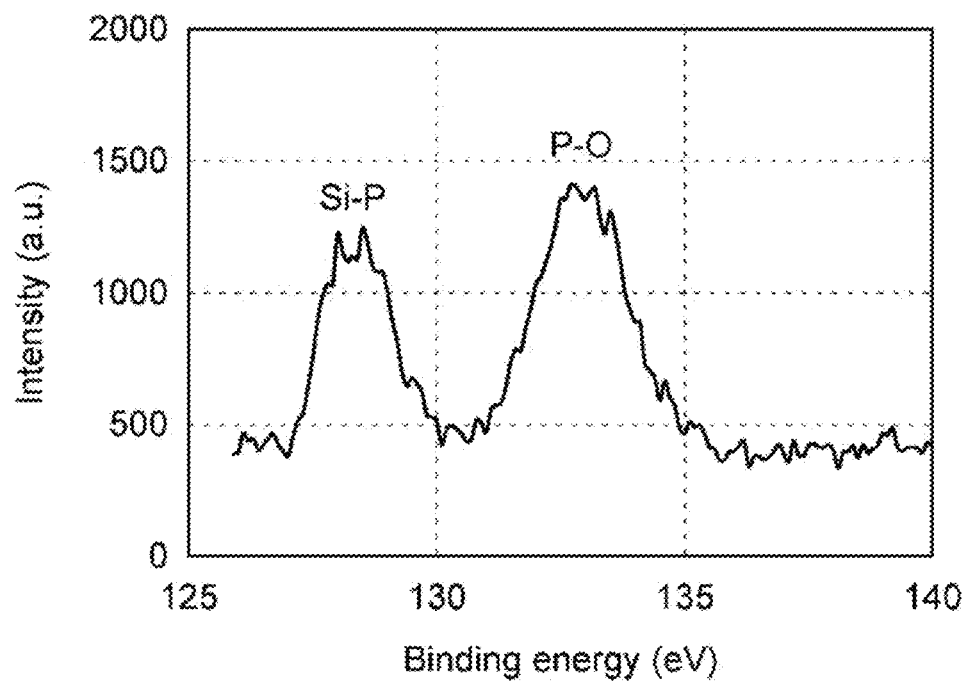
FIG. 6A is a graph showing the results of X-ray photoelectron spectroscopy (XPS) analysis of a protective film PF formed in an experimental example including step STP of etching a silicon oxide film.
Figure 6B:
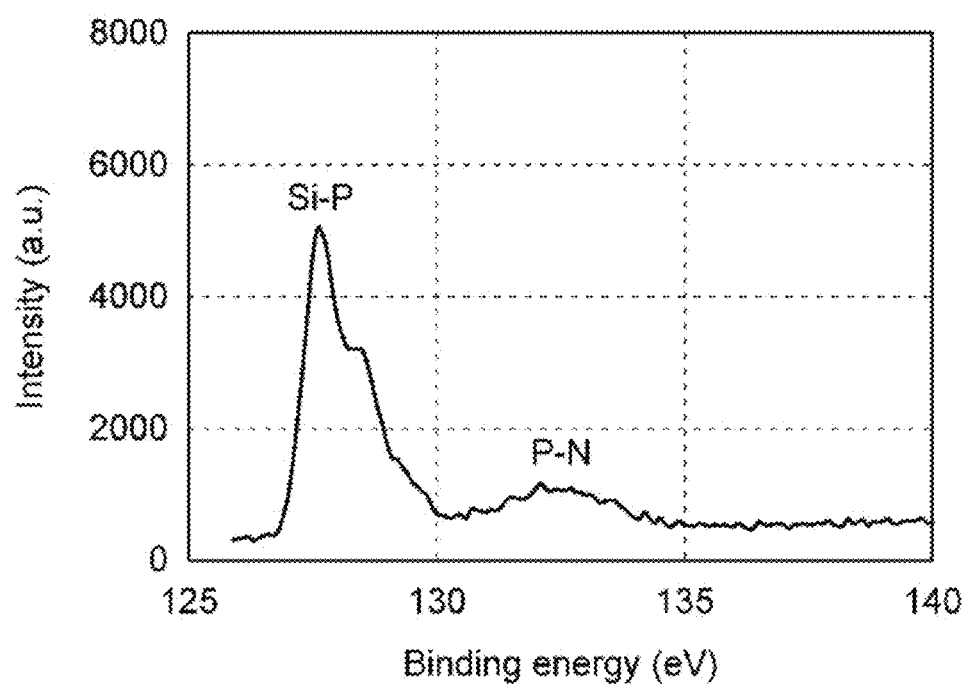
FIG. 6B is a graph showing the results of XPS analysis of a protective film PF formed in an experimental example including step STP of etching a silicon nitride film.

FIG. 6A is a graph showing the results of X-ray photoelectron spectroscopy (XPS) analysis of a protective film PF formed in an experimental example including step STP of etching a silicon oxide film. FIG. 6B is a graph showing the results of XPS analysis of a protective film PF formed in an experimental example including step STP of etching a silicon nitride film. The graphs in FIGS. 6A and 6B each show a $P_2p$ spectrum. Step STP is performed in the experimental examples under the conditions described below.

Conditions for step STP:
Gas pressure in the chamber 10: 100 mTorr (13.33 Pa)
Process gas: $PF_3$, 50 sccm; and Ar, 150 sccm
RF power HF (continuous wave): 40 MHz, 4500 W RF power LF (continuous wave): 400 kHz, 7000 W Substrate temperature (substrate support temperature before etching): −70° C.

Processing time: 30 s

For an experimental example including step STP of etching a silicon oxide film, XPS analysis of the protective film PF reveals a peak assigned to the Si—P bond and a peak assigned to the P—O bond as shown in FIG. 6A. For an experimental example including step STP of etching a silicon nitride film, XPS analysis of the protective film PF reveals a peak assigned to the Si—P bond and a peak assigned to the P—N bond as shown in FIG. 6B.

With a phosphorus-free process gas, the silicon-containing film SF is etched laterally as shown in FIG. 4B. The resultant silicon-containing film SF can thus have a partly wider recess. For example, the silicon-containing film SF can have a recess that is partly wider around the mask MK.

With the method MT, the protective film PF is formed on the surface of a side wall defining a recess in the silicon-containing film SF that is formed by etching. The protective film PF then protects the side wall surface while the silicon-containing film SF is being etched. The method MT thus enables plasma etching of the silicon-containing film SF with reduced lateral etching.

In one embodiment, one or more cycles each including steps ST2 and ST3 may be performed sequentially during step STP, or more specifically, while plasma is being generated from the process gas in step STP. In step STP, two or more such cycles may be performed sequentially.

In one embodiment, as indicated by a broken line in FIG. 5, the pulsed electrical bias described above may be applied from the bias power supply 64 to the lower electrode 18 in step STP. In other words, the pulsed electrical bias may be applied from the bias power supply 64 to the lower electrode 18 while the plasma generated from the process gas is in the chamber 10. In this embodiment, the silicon-containing film SF is etched in step ST2 mainly in the periods H of the pulsed electrical bias. The protective film PF is formed in step ST3 mainly in the periods L of the pulsed electrical bias.

The RF power LF used as the electrical bias may be set to a power level of 2 kW or more in the periods H of the pulsed electrical bias. The RF power LF may be set to a power level of 10 kW or more in the periods H of the pulsed electrical bias.

In one embodiment, as indicated by a broken line in FIG. 5, the pulsed-RF power HF described above may be provided in step STP. The RF power HF may be set to a power level of 1 to 10 kW inclusive in the periods H of the pulsed-RF power HF. As shown in FIG. 5, the periods of the pulsed-RF power HF may be synchronized with the periods of the pulsed electrical bias. As shown in FIG. 5, the periods H of the pulsed-RF power HF may be or may not be synchronized with the periods H of the pulsed electrical bias. The periods H of the pulsed-RF power HF may be the same durations as or may be durations different from the periods H of the pulsed electrical bias.

Figure 7:
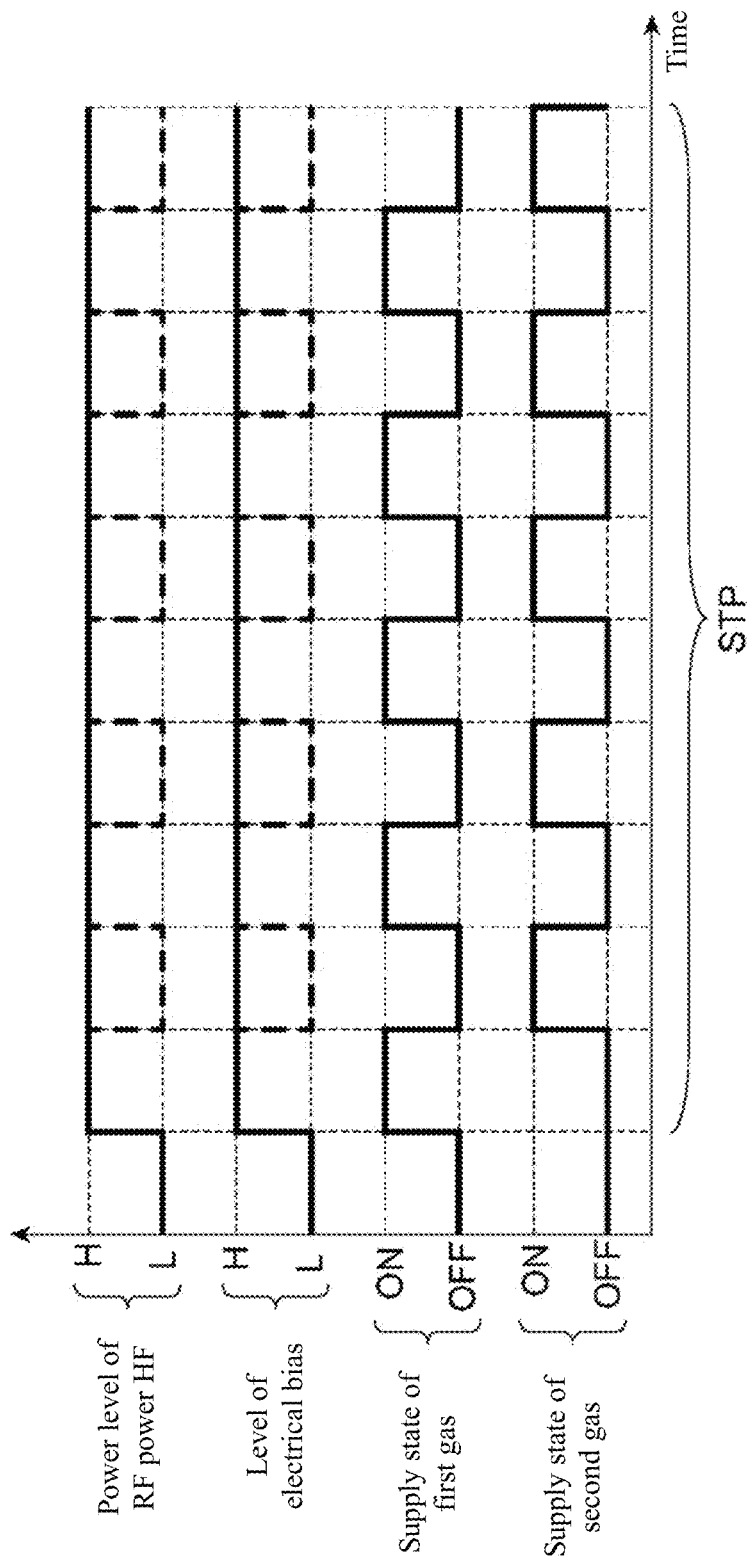
FIG. 7 is another exemplary timing chart of an etching method according to an exemplary embodiment.

FIG. 7 is another exemplary timing chart of an etching method according to an exemplary embodiment. In FIG. 7, the horizontal axis indicates time. In FIG. 7, the vertical axis indicates the power level of the RF power HF, the level of the electrical bias, the supply state of the first gas, and the supply state of the second gas. The RF power HF at L level indicates that the RF power HF is not being provided or is being provided at a power level lower than at the H level. The electrical bias at L level indicates that the electrical bias is not being applied to the lower electrode 18 or is being applied at a level lower than at the H level. The first gas in the ON supply state indicates that the first gas is being supplied into the chamber 10, and in the OFF supply state indicates that its supply into the chamber 10 is stopped. The second gas in the ON supply state indicates that the second gas is being supplied into the chamber 10, and in the OFF supply state indicates that its supply into the chamber 10 is stopped.

As shown in FIG. 7, the first gas and the second gas may be alternately supplied into the chamber 10 in step STP. The silicon-containing film SF is etched in step ST2 mainly while the first gas is being supplied into the chamber 10. The protective film PF is formed in step ST3 mainly while the second gas is being supplied into the chamber 10.

As indicated by a solid line in FIG. 7, the continuous-wave RF power HF may be provided in step STP. In some embodiments, the pulsed-RF power HF may be provided in step STP in the same manner as the pulsed-RF power HF as shown in FIG. 5. In FIG. 7, the pulsed-RF power HF is indicated by a broken line. The periods H of the pulsed-RF power HF are synchronized with or partially overlap the periods in which the first gas is supplied into the chamber 10. The periods L of the pulsed-RF power HF are synchronized with or partially overlap the periods in which the second gas is supplied into the chamber 10.

As indicated by a solid line in FIG. 7, the continuous-wave electrical bias may be applied to the lower electrode 18 in step STP. In some embodiments, the pulsed electrical bias may be applied to the lower electrode 18 in step STP in the same manner as the pulsed electrical bias as shown in FIG. 5. In FIG. 7, the pulsed electrical bias is indicated by a broken line. The periods H of the pulsed electrical bias are synchronized with or partially overlap the periods in which the first gas is supplied into the chamber 10. The periods L of the pulsed electrical bias are synchronized with or partially overlap the periods in which the second gas is supplied into the chamber 10. An advantage offered by pulsing the electric power for biasing, during etching is that a bifurcation of etching and deposition phases is created, rather than mainly deposition or mainly etching. Moreover, when bias electric power is supplied to a bottom electrode, etching mainly occurs. On the other hand, when bias electric power is not supplied to the bottom electrode, deposition mainly occurs. By applying pulsed bias electric power, separate, but interleaved, etch phases and deposition phases are realized. For the etch phase, the etching occurs after the protective film is formed, and then the sidewall of the recess is protected from side-etch. Thus, successive phases of forming a protection film (deposition) followed by etching results in controlled etching that suppresses side-wall bowing while a depth of the recess continues to deepen. In addition, changing the duty cycle of the pulse ((Bias-on time/(Bias-on time+Bias-off time)) provides a mechanism for controlling a balance between etch/deposition phases. A longer Bias-off time helps form a thicker protective layer, which leads to more protection from sidewall etch. Longer Bias-on time increase etch rate, thus controlling the time required to reach a predetermined etch depth.

Figure 8:
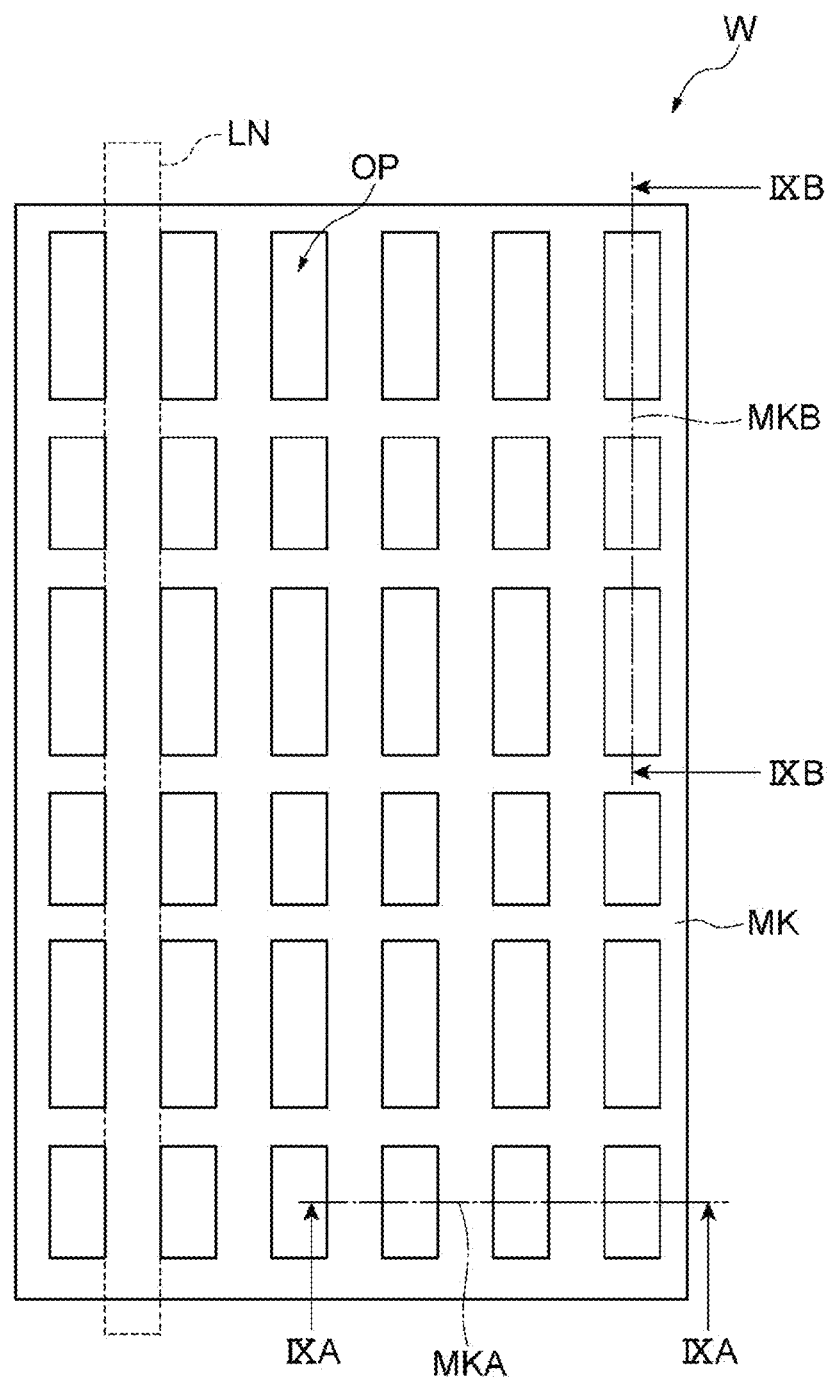
FIG. 8 is a plan view of another exemplary substrate.
Figure 9A:
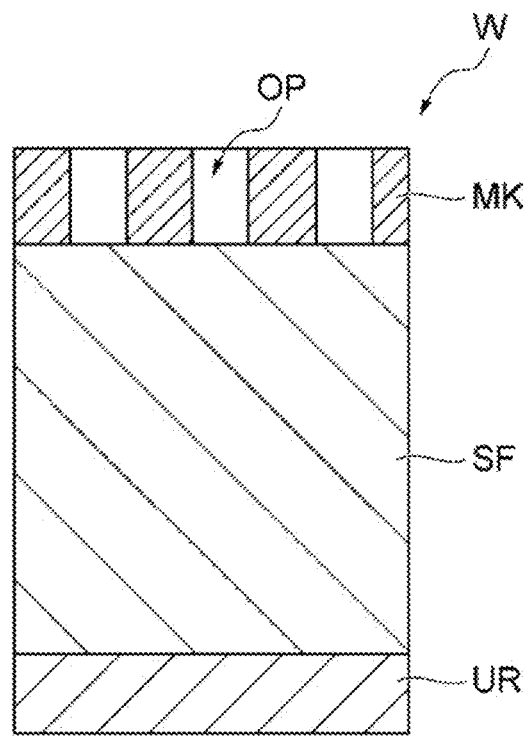
FIG. 9A is a cross-sectional view taken along line IXA-IXA in FIG. 8.
Figure 9B:
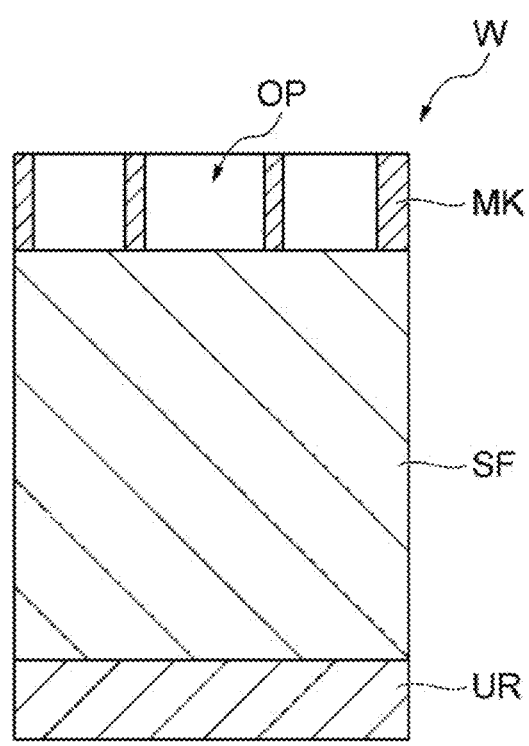
FIG. 9B is a cross-sectional view taken along line IXB-IXB in FIG. 8.

FIG. 8 is a plan view of another exemplary substrate. FIG. 9A is a cross-sectional view taken along line IXA-IXA in FIG. 8. FIG. 9B is a cross-sectional view taken along line IXB-IXB in FIG. 8. A substrate to be processed with the method MT may include a mask MK on a substrate W shown in FIGS. 8, 9A, and 9B. More specifically, the mask on the substrate to be processed with the method MT may include a portion with a higher proportion of mask material than openings defined in the mask on a silicon-containing film SF and a portion with a lower proportion of mask material than the openings.

The mask MK on the substrate W shown in FIGS. 8, 9A, and 9B contains carbon. The mask MK is formed from, for example, an amorphous carbon film, a photoresist film, or a spin-on-carbon (SOC) film.

The mask MK on the substrate W shown in FIGS. 8, 9A, and 9B has multiple openings OP. The mask MK includes a portion MKA with a higher proportion of material of the mask MK than the openings OP defined in the mask MK on the silicon-containing film SF and a portion MKB with a lower proportion of material of the mask MK than the openings OP. The portion MKA with a higher proportion of material of the mask MK than the openings OP refers to a mask portion containing more mask material, or a higher density region. The portion MKB with a lower proportion of material of the mask MK than the openings OP refers to a mask portion containing less mask material, or a lower density region. The proportion herein refers to the proportion of the surface area of the mask MK per unit area on the surface of the silicon-containing film SF, or the proportion of the length of the mask MK per unit length on the surface of the silicon-containing film SF.

As shown in FIG. 8, the multiple openings OP may each have a planar rectangular shape. In some embodiments, the multiple openings OP may each have another planar shape such as a circle or an ellipse. As shown in FIG. 8, the multiple openings OP may be arranged two-dimensionally in rows and columns. The substrate W shown in FIGS. 8, 9A, and 9B includes the portion MKA having a pattern of the mask MK in either of the row-direction or the column-direction in the above arrangement and the portion MKB having a pattern of the mask MK in the other direction.

In plasma etching of the silicon-containing film SF, the mask MK is typically etched more in a lower density region than in a higher density region. When the mask MK on the substrate W shown in FIGS. 8, 9A, and 9B is etched more in a lower density region than in a higher density region, a line LN is distorted due to the internal stress of the mask MK. The distorted line LN increases the line edge roughness (LER) and the line width roughness (LWR). With the method MT, a bond between the carbon contained in the mask MK and the phosphorus in plasma generated in step STP is formed on the surface of the mask MK. This carbon-phosphorus bond on the surface of the mask MK has higher bond energy than a carbon-carbon bond in the mask MK. With the method MT, the carbon-phosphorus bond on the surface of the mask MK thus protects the mask MK in etching of the silicon-containing film SF in step ST2. The method MT thus protects the substrate W in plasma etching of the silicon-containing film SF. The carbon-phosphorus bond on the surface of the mask MK causes less etching of the mask MK in a lower density region. The mask MK is etched by amounts with a reduced difference between its lower density region and its higher density region. This reduces failures in the features of the mask MK including a lower density region and a higher density region.

A first experiment for evaluating the method MT will now be described. In the first experiment, multiple sample substrates with the same structure as the substrate W shown in FIG. 2 were prepared. Each of the sample substrates includes a silicon oxide film and a mask on the silicon oxide film. The mask is formed from an amorphous carbon film. In the first experiment, the sample substrates underwent the processing in step STP included in the method MT. For each sample substrate, a process gas containing $PF_3$ with a different flow rate was used. Step STP is performed under the other conditions described below. For each sample substrate, the process gas containing $PF_3$ has a flow rate varying from 0, 15, 30, 50, and to 100 sccm. More specifically, for each sample substrate, the second gas has the flow rate ratio, or the ratio of its flow rate to the flow rate of the first gas, ranging from 0, 0.075, 0.15, 0.25, to 0.5 in the first experiment.

Figure 10:
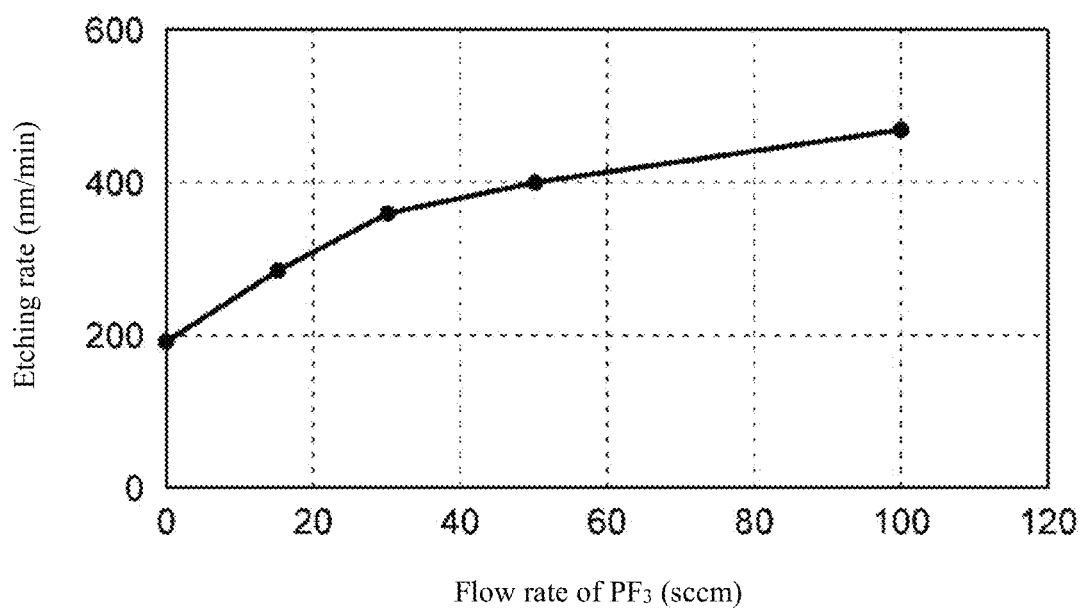
FIG. 10 is a graph showing the relationship between the flow rate of $PF_3$ in a process gas and the etching rate of a silicon oxide film, obtained in a first experiment.
Figure 11:
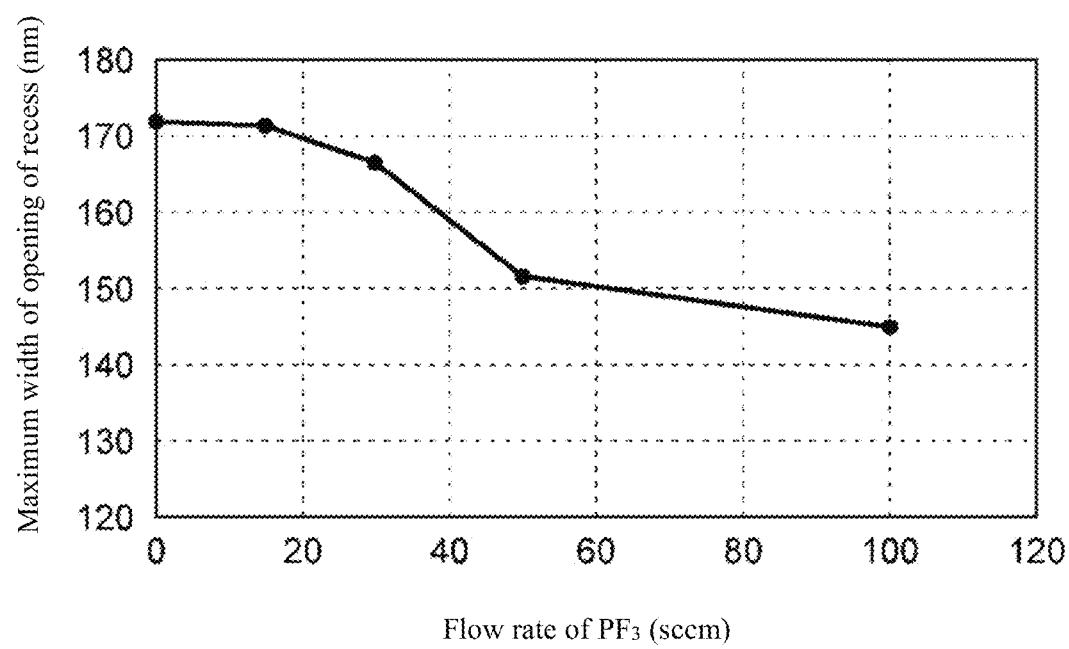
FIG. 11 is a graph showing the relationship between the flow rate of $PF_3$ in the process gas and the maximum width of an opening of a recess in the silicon oxide film, obtained in the first experiment.
Figure 12:
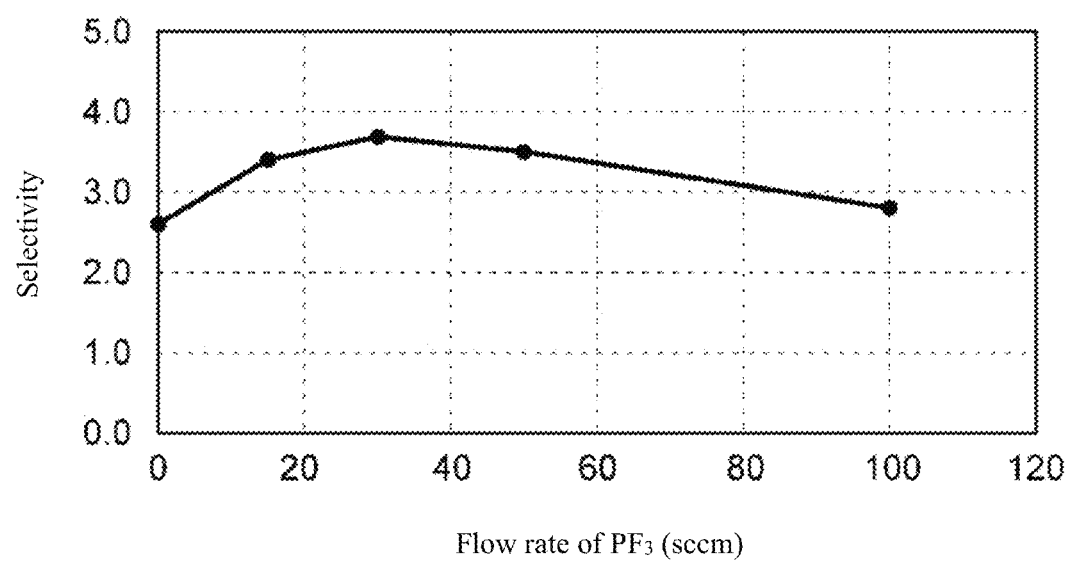
FIG. 12 is a graph showing the relationship between the flow rate of $PF_3$ in the process gas and selectivity, obtained in the first experiment.

Conditions for step STP:
Gas pressure in the chamber 10: 25 mTorr (3.3 Pa)
Process gas: $CH_4$, 50 sccm; $CF_4$, 100 sccm; and $O_2$, 50 sccm
RF power HF (continuous wave): 40 MHz, 4500 W
RF power LF (continuous wave): 400 kHz, 7000 W
Sample substrate temperature (substrate support temperature before etching): −30° C.
Processing time: 600 s For each sample substrate, the etching rate of the silicon oxide film, the maximum width of an opening of a recess formed in the silicon oxide film, and the selectivity were determined in the first experiment. The selectivity refers to the value obtained by dividing the etching rate of the silicon oxide film by the etching rate of the mask. The relationship between the flow rate of $PF_3$ in the process gas used in step STP and the etching rate of the silicon oxide film was obtained in the first experiment. The relationship between the flow rate of $PF_3$ in the process gas used in step STP and the maximum width of the opening of the recess in the silicon oxide film was also obtained. The relationship between the flow rate of $PF_3$ in the process gas used in step STP and the selectivity was also obtained. FIG. 10 shows the relationship between the flow rate of $PF_3$ in the process gas and the etching rate of the silicon oxide film. FIG. 11 shows the relationship between the flow rate of $PF_3$ in the process gas and the maximum width of the opening of the recess in the silicon oxide film. FIG. 12 shows the relationship between the flow rate of $PF_3$ in the process gas and selectivity.

As shown in FIGS. 10 and 12, the process gas containing phosphorus as a component thereof, or specifically, the process gas with the second gas having the flow rate ratio, or the ratio of its flow rate to the flow rate of the first gas, larger than 0 increases the etching rate of the silicon oxide film and the selectivity. As shown in FIG. 12, the selectivity is notably high with the process gas containing $PF_3$ at the flow rate of 15 to 60 or 50 sccm inclusive. In other words, the selectivity is notably high with the flow rate ratio of 0.075 to 0.3 or 0.25 inclusive. As shown in FIG. 10, the etching rate obtained with the process gas containing $PF_3$ at the flow rate of 20 sccm or more, or specifically, with the process gas having the flow rate ratio of 0.1 or more, is about 1.5 times the etching rate obtained with the process gas containing no $PF_3$.

As shown in FIG. 11, the process gas containing phosphorus (as a component of the process gas) reduces the maximum width of the opening of the recess in the silicon oxide film, or specifically, reduces the likelihood that the recess in the silicon oxide film becomes partly wider. In particular, the process gas containing $PF_3$ at the flow rate of 50 sccm or more notably reduces the likelihood that the recess in the silicon oxide film becomes partly wider. Moreover, in FIG. 11, The x axis exhibits a flow rate of $PF_3$, and they axis exhibits a maximum width of an opening (nm) of the etching recess. An amount of etchant increases as $PF_3$ flow increases, and an increase in etchant leads to an etching rate increase (see FIG. 10). As $PF_3$ increases, vertical etching rate increases. However, as $PF_3$ flow rate increases, a maximum width of an opening of the recess remains almost constant (slightly smaller) to a flow rate of 15 sccm (7.5%). For a flow rate beyond 15 sccm (7.5%), the maximum width of the opening of the recess decreases. Accordingly, use of a P containing gas during etch efficiently suppresses side etch (bowing). With regard to a P—O bond containing protective film, a protective layer with a P—O bond has a low volatility (i.e., is chemically strong). As recognized by the present inventor, the existence of the protective layer with a P—O bond is effective at protecting the side wall of the recess in a Si-containing layer from being removed by ion attack with relatively low energy. On the other hand, ions incident on the bottom of the recess have a higher energy and thus remove (etch) the bottom of the recess even when the protective layer is formed on the bottom of the recess. Thus, the P—O bond protective layer preferentially protects against undesired sidewall etch because the P—O bond protective layer is sufficiently chemically strong enough to avoid being removed by lower energy ions that impart a glancing blow on the sidewall, while higher ions that bombard the bottom of the recess via a direct impact are sufficiently high in energy to etch through the P—O bond protective layer at the bottom of the recess. In turn, this allows for etching higher aspect ratio recesses with sidewall-bowing suppression.

A second experiment for evaluating the method MT will now be described. In the second experiment, multiple sample substrates with the same structure as the substrate W shown in FIGS. 8, 9A, and 9B were prepared. Each of the sample substrates includes a silicon oxide film and a mask on the silicon oxide film. The mask is formed from an amorphous carbon film. In the second experiment, the sample substrates underwent the processing in step STP included in the method MT. For each sample substrate, a process gas containing $PF_3$ with a different flow rate was used. In the second experiment, step STP is performed under the same other conditions as in the first experiment.

Figure 13:
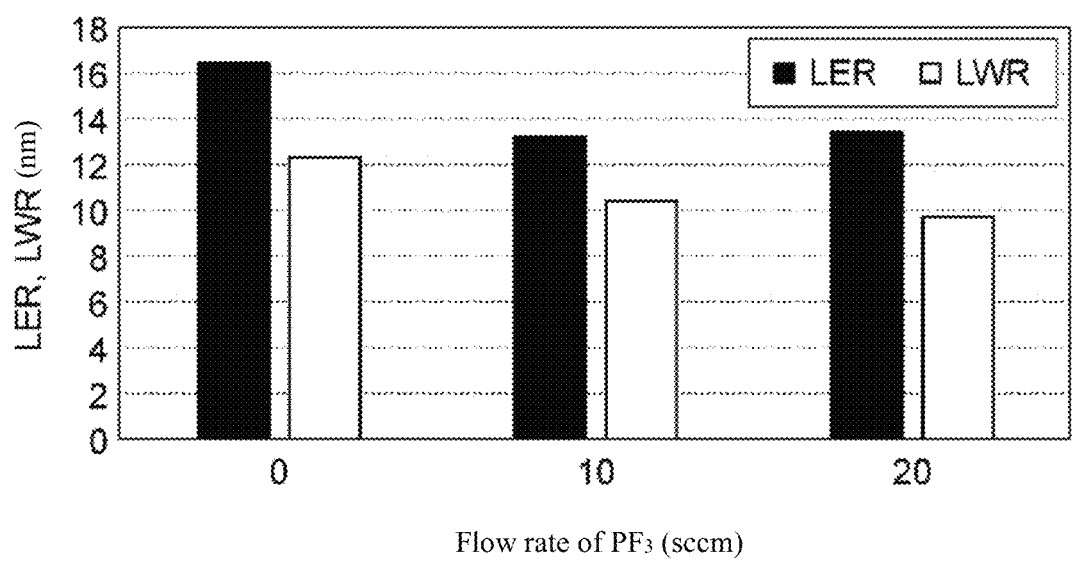
FIG. 13 is a graph showing the relationship between the flow rate of $PF_3$ in a process gas and line edge roughness (LER) and line width roughness (LWR), obtained in a second experiment.

In the second experiment, LER and LWR of the line LN in the mask MK on the substrate W after the processing in step STP were obtained. FIG. 13 shows the relationship between the flow rate of $PF_3$ in the process gas and LER and LWR, obtained in the second experiment. As shown in FIG. 13, LER and LWR are smaller as the flow rate of $PF_3$ in the process gas increases, indicating less failures in the features of the mask MK at a higher flow rate of $PF_3$ in the process gas.

Figure 14:
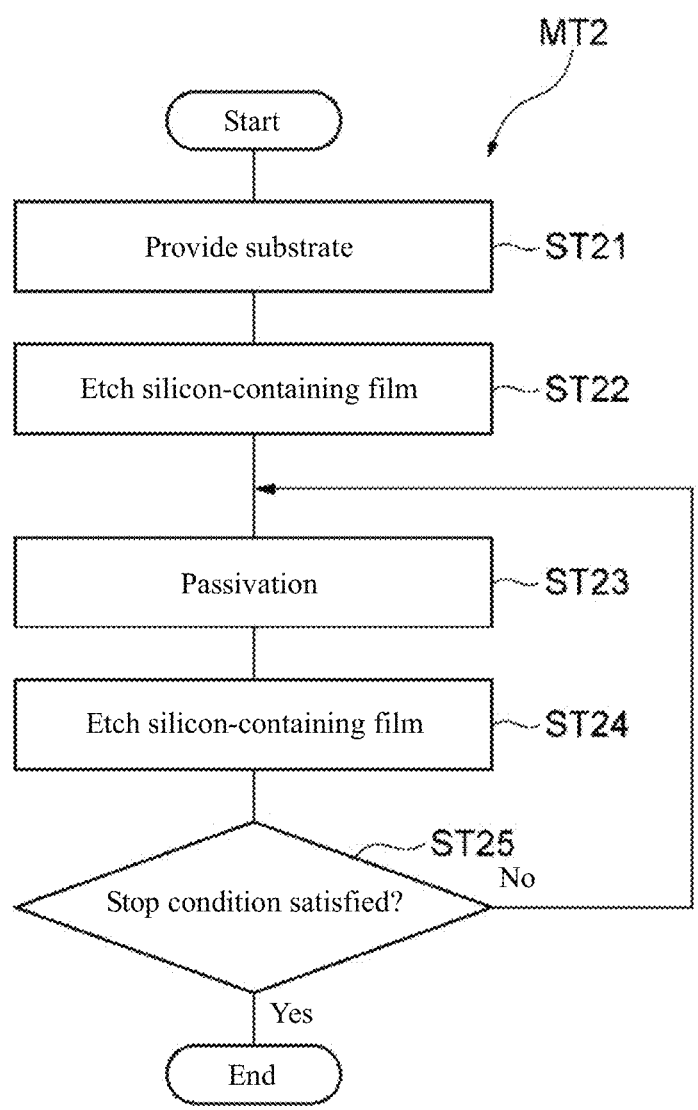
FIG. 14 is a flowchart of an etching method (method MT2) according to another exemplary embodiment.
Figure 15C:
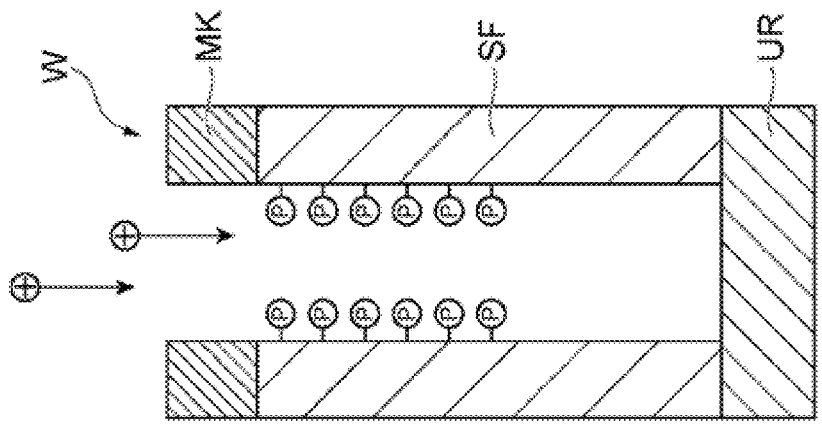
FIG. 15C is the same view of the exemplary substrate processed with the method MT2.
Figure 15B:
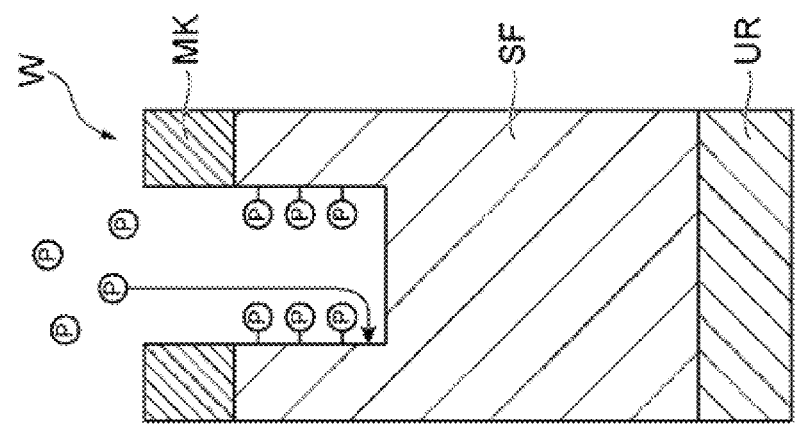
FIG. 15B is the same view of the exemplary substrate undergoing step ST23 of the method MT2.
Figure 15A:
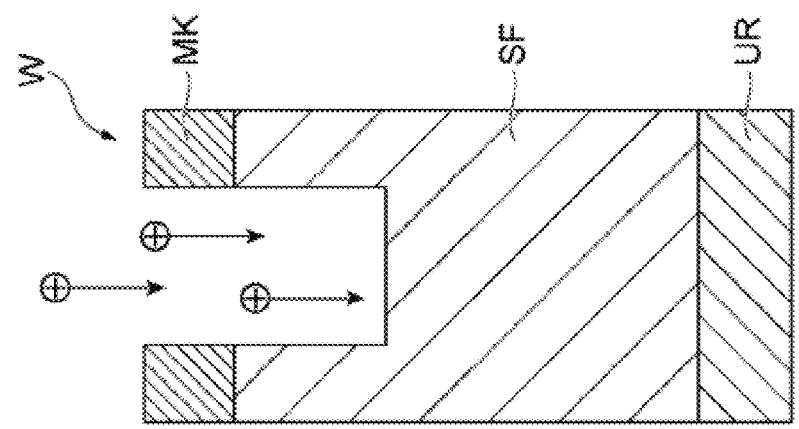
FIG. 15A is a partially enlarged cross-sectional view of an exemplary substrate undergoing step ST22 of the method MT2.

An etching method according to another exemplary embodiment will now be described. FIG. 14 is a flowchart of an etching method according to another exemplary embodiment (hereinafter referred to as the method MT2). FIG. 15A is a partially enlarged cross-sectional view of an exemplary substrate undergoing step ST22 of the method MT2, FIG. 15B is the same view of the exemplary substrate undergoing step ST23 of the method MT2, and FIG. 15C is the same view of the exemplary substrate processed with the method MT2. The method MT2 used by the plasma processing apparatus 1 will be described by way of example.

The method MT2 shown in FIG. 14 may be used for a substrate W including a silicon-containing film SF and a mask MK, like the substrate shown in FIG. 2. The method MT2 starts from step ST21. The processing in step ST21 is the same as the processing in step ST1 included in the method MT. In step ST21, a substrate W is provided in the chamber 10. The substrate W is placed onto and held by the ESC 20 in the chamber 10. The substrate W placed in the chamber 10 may undergo steps ST22, ST23, and ST24 of the method MT2.

The method MT2 includes step ST22 following step ST21. In step ST22, a silicon-containing film SF is etched. In step ST22, the substrate W receives a halogen chemical species (or halogen component of the process gas) to etch the silicon-containing film SF partially as shown in FIG. 15A. The halogen chemical species are, for example, ions indicated by the circled symbol + in FIG. 15A.

The halogen chemical species used in step ST22 is contained in plasma generated from an etching gas. The etching gas contains a halogen-containing gas. The halogen-containing gas may contain a fluorine-containing gas. The fluorine-containing gas may contain at least one selected from the group consisting of hydrogen fluoride, nitrogen trifluoride ($NF_3$), sulfur hexafluoride ($SF_6$), the fluorocarbons listed above, and the hydrofluorocarbons listed above. The etching gas containing the fluorocarbon may be used for a silicon-containing film SF including a silicon oxide film. The etching gas containing the hydrofluorocarbon may be used for a silicon-containing film SF including a silicon nitride film. When the silicon-containing film SF contains polycrystalline silicon, the halogen-containing gas may contain a halogen gas such as a $Cl_2$ gas. Similarly to the above first gas, the etching gas may further contain carbon and hydrogen. The etching gas may further contain at least one of a gas containing the hydrogen-containing molecule listed above or a gas containing the carbon-containing molecule listed above. The etching gas may further contain oxygen. The etching gas may contain an $O_2$ gas.

To perform the processing in step ST22, the controller 80 controls the controllable gas supply to supply the etching gas into the chamber 10. The controller 80 also controls the exhaust device 50 to maintain the chamber 10 at a specified gas pressure. The controller 80 also controls the plasma generator to generate plasma from the etching gas in the chamber 10. The controller 80 included in the plasma processing apparatus 1 controls the RF power supply 62 and the bias power supply 64 to provide the RF power HF, the RF power LF, or RF power HF and the electrical bias.

The method MT2 includes steps ST23 and ST24 performed sequentially, following step ST22. In step ST23, the substrate W receives a phosphorus chemical species (or phosphorous component of the process gas) as shown in FIG. 15B. The phosphorus chemical species are, for example, an active phosphorus species of ions, radicals, or both each indicated by the circled symbol P in FIG. 15B. In step ST23, a bond between an element contained in the silicon-containing film SF and phosphorus is formed on the surface of a side wall defining a recess in the silicon-containing film SF as shown in FIG. 15B. When the silicon-containing film SF includes a silicon oxide film, a phosphorus-oxygen bond is formed on the side wall surface of the silicon-containing film SF. In step ST23, the side wall surface of the silicon-containing film SF is inactivated (or passivated) by the phosphorus chemical species. The side wall surface of the silicon-containing film SF is thus passivated. For the mask MK containing carbon, a carbon-phosphorus bond may be formed on the surface of the mask MK in step ST23.

The phosphorus chemical species used in step ST23 is contained in plasma generated from a passivation gas. The passivation gas used in step ST23 contains a phosphorus-containing gas. The phosphorus-containing gas contains at least one of the phosphorus-containing molecules listed above. In one embodiment, the phosphorus-containing gas may not contain fluorine. The phosphorus-containing gas may contain $PCl_3$ or $POCl_3$.

To perform the processing in step ST23, the controller 80 controls the controllable gas supply to supply the passivation gas into the chamber 10. The controller 80 also controls the exhaust device 50 to maintain the chamber 10 at a specified gas pressure. The controller 80 also controls the plasma generator to generate plasma from the passivation gas in the chamber 10. The controller 80 included in the plasma processing apparatus 1 controls the RF power supply 62 and the bias power supply 64 to provide the RF power HF, the RF power LF, or RF power HF and the electrical bias.

In step ST24, the silicon-containing film SF is etched further. The processing in step ST24 is the same as the processing in step ST22. More specifically, in step ST24, the silicon-containing film SF is etched with a halogen chemical species in plasma generated from the etching gas.

In one embodiment, step ST23 and step ST24 may be repeated alternately. In this case, the method MT2 may further include step ST25. In step ST25, the determination is performed as to whether a stop condition is satisfied. In step ST25, the stop condition is satisfied when, for example, the count of cycles including steps ST23 and ST24 reaches a predetermined number. When the stop condition is not satisfied in step ST25, such cycles are restarted. When the stop condition is satisfied in step ST25, the method MT2 ends. When the method MT2 ends, the underlying region UR may be exposed as shown in FIG. 15C.

The phosphorus chemical species used in step ST23 may be contained in plasma generated external to the chamber accommodating the substrate W. Different plasma processing apparatuses may be used in steps ST23 and ST24. In this case, the substrate W may be transferred between the plasma processing apparatus used in step ST23 and the plasma processing apparatus used in step ST24 through a decompressed space alone (or in other words, without breaking a vacuum).

Figure 16:
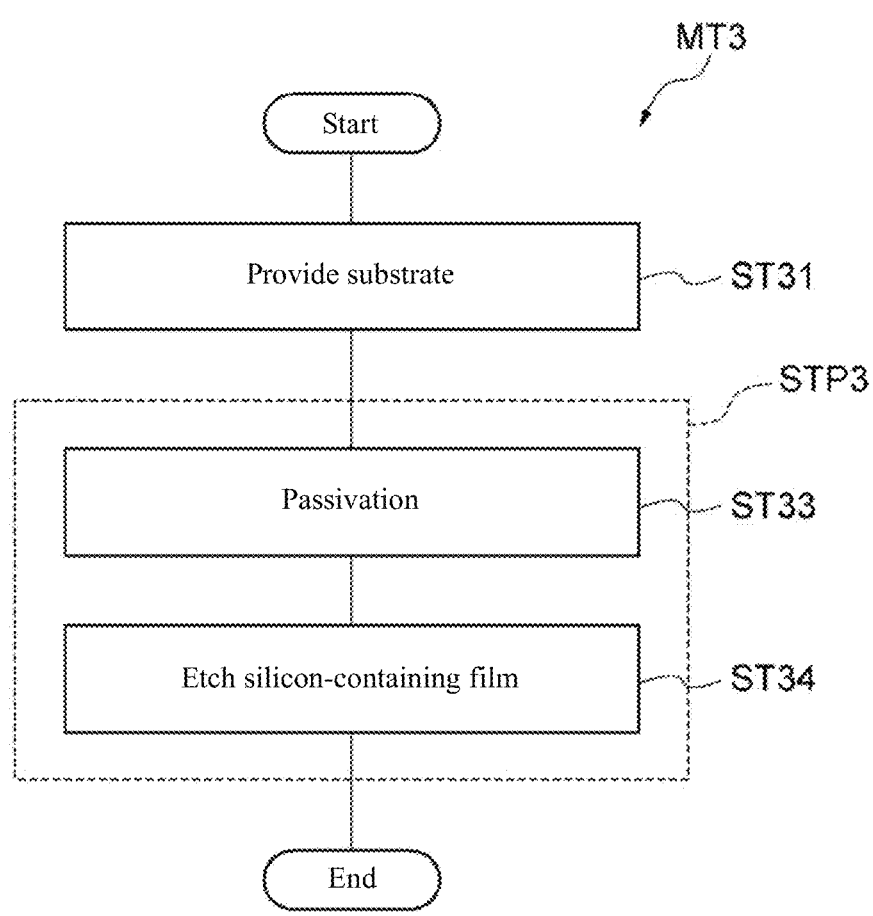
FIG. 16 is a flowchart of an etching method (method MT3) according to still another exemplary embodiment.
Figure 17B:
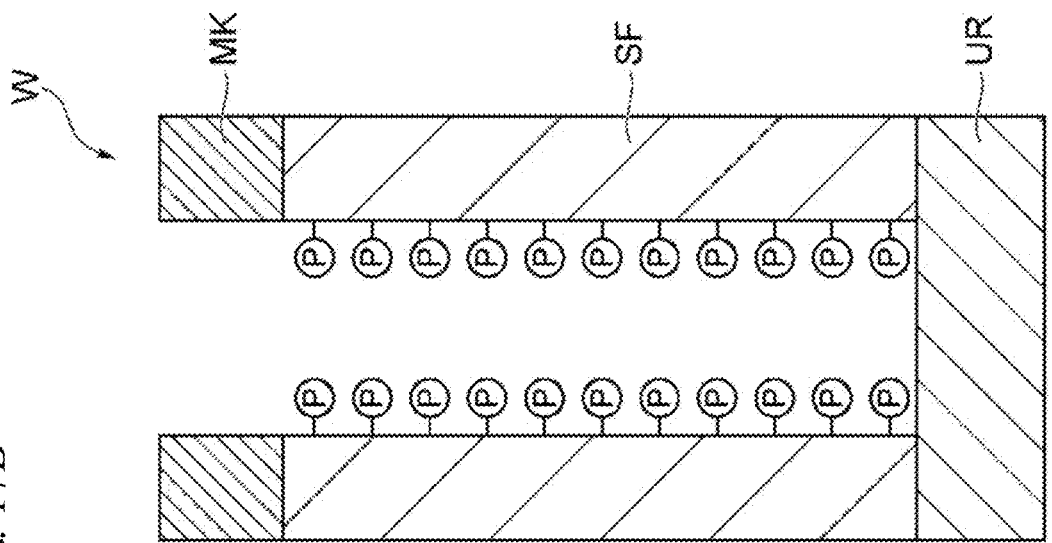
FIG. 17B is the same view of the exemplary substrate processed with the method MT3.
Figure 17A:
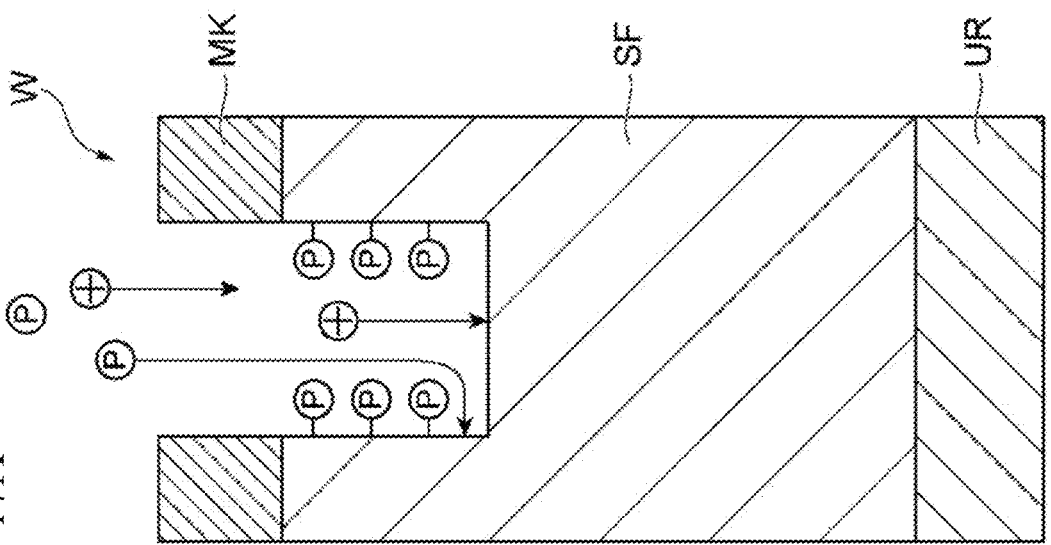
FIG. 17A is a partially enlarged cross-sectional view of an exemplary substrate undergoing step STP3 of the method MT3.

An etching method according to still another exemplary embodiment will now be described. FIG. 16 is a flowchart of an etching method according to still another exemplary embodiment (hereinafter referred to as the method MT3). FIG. 17A is a partially enlarged cross-sectional view of an exemplary substrate undergoing step STP3 of the method MT3. FIG. 17B is the same view of the exemplary substrate processed with the method MT3. The method MT3 used by the plasma processing apparatus 1 will be described by way of example.

The method MT3 shown in FIG. 16 may be used for a substrate W including a silicon-containing film SF and a mask MK, like the substrate shown in FIG. 2. The method MT3 starts from step ST31. The processing in step ST31 is the same as the processing in step ST1 included in the method MT. In step ST31, the substrate W is provided in the chamber 10. The substrate W is placed onto and held by the ESC 20 in the chamber 10. Step STP3 included in the method MT3 is performed with the substrate W placed in the chamber 10.

Step STP3 includes steps ST33 and ST34 performed at the same time. The processing in step ST33 is the same as the processing in step ST23 included in the method MT2. In step ST33, the substrate W receives a phosphorus chemical species to perform passivation on a side wall surface of a silicon-containing film SF as shown in FIG. 17A. The phosphorus chemical species is indicated by the circled symbol P in FIG. 17A. The processing in step ST34 is the same as the processing in step ST24 included in the method MT2. In step ST34, the substrate W receives a halogen chemical species to etch the silicon-containing film SF as shown in FIG. 17A. The halogen chemical species is indicated by the circled symbol + in FIG. 17A.

To perform the processing in steps ST33 and ST34 at the same time, plasma is generated from a process gas in the chamber 10 in step STP3. The process gas contains the passivation gas described above for step ST23 and the etching gas described above for step ST22.

To perform the processing in step STP3, the controller 80 controls the controllable gas supply to supply the process gas into the chamber 10. The controller 80 also controls the exhaust device 50 to maintain the chamber 10 at a specified gas pressure. The controller 80 also controls the plasma generator to generate plasma from the process gas in the chamber 10. The controller 80 included in the plasma processing apparatus 1 controls the RF power supply 62 and the bias power supply 64 to provide the RF power HF, the RF power LF, or RF power HF and the electrical bias.

With each of the methods MT2 and MT3, the side wall surface of the silicon-containing film SF is inactivated (or passivated) by phosphorus. The side wall surface is thus passivated. With each of the methods MT2 and MT3, a side wall surface is protected to enable plasma etching of the silicon-containing film SF with reduced lateral etching. Each of the methods MT2 and MT3 thus protects the substrate W in plasma etching of the silicon-containing film SF.

Although the exemplary embodiments have been described above, the embodiments are not restrictive, and various additions, omissions, substitutions, and changes may be made. The components in the different exemplary embodiments may be combined to form another exemplary embodiment.

The plasma processing apparatus using the method MT, MT2, or MT3 may be a capacitively coupled plasma processing apparatus other than the plasma processing apparatus 1. In some embodiments, the plasma processing apparatus using the method MT, MT2, or MT3 may be a plasma processing apparatus other than a capacitively coupled plasma processing apparatus. Examples of such plasma processing apparatuses include an inductively coupled plasma processing apparatus, an electron cyclotron resonance (ECR) plasma processing apparatus, and a plasma processing apparatus that generates plasma using surface waves such as microwaves.

The plasma processing apparatus may include, in addition to the bias power supply 64 that provides the RF power LF to the lower electrode 18, another bias power supply that intermittently or periodically applies a pulsed negative DC voltage to the lower electrode 18.

Figure 18:
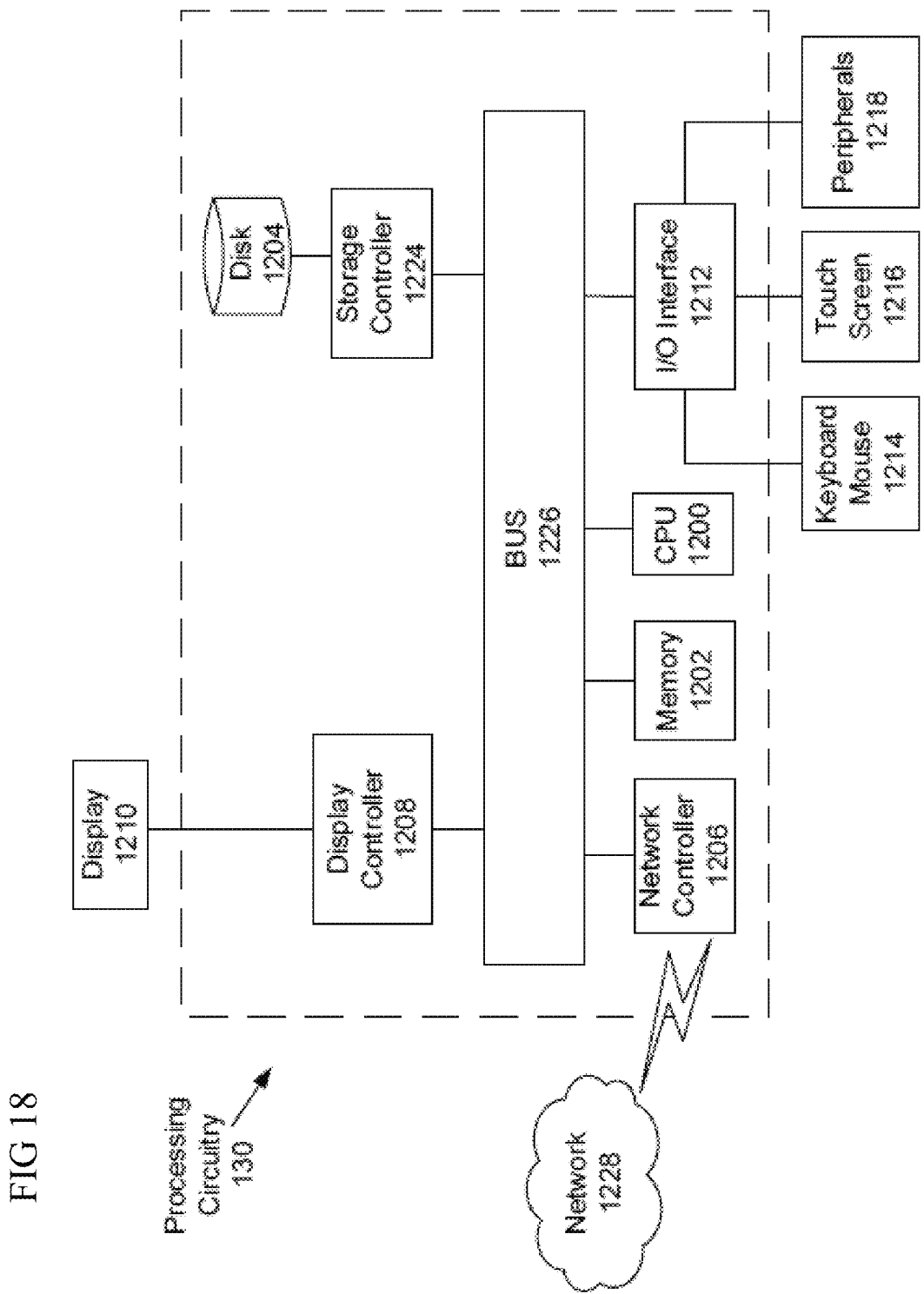
FIG. 18 is a diagram of controller circuitry used to control process operations, such as the plasma treatment system of FIG. 3 and other processes and equipment described herein.

FIG. 18 is a block diagram of processing circuitry for performing computer-based operations described herein. FIG. 18 illustrates control circuitry 130 that may be used to control any computer-based control processes, descriptions or blocks in flowcharts can be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art. The various elements, features, and processes described herein may be used independently of one another or may be combined in various ways. All possible combinations and sub-combinations are intended to fall within the scope of this disclosure.

In FIG. 18, the processing circuitry 130 includes a CPU 1200 which performs one or more of the control processes described above/below. The process data and instructions may be stored in memory 1202. These processes and instructions may also be stored on a storage medium disk 1204 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the processing circuitry 130 communicates, such as a server or computer.

Further, the claimed advancements may be provided as a utility application, background daemon, or component of an operating system, or combination thereof, executing in conjunction with CPU 1200 and an operating system such as Microsoft Windows, UNIX, Solaris, LINUX, Apple MAC-OS and other systems known to those skilled in the art.

The hardware elements in order to achieve the processing circuitry 130 may be realized by various circuitry elements. Further, each of the functions of the above described embodiments may be implemented by circuitry, which includes one or more processing circuits. A processing circuit includes a particularly programmed processor, for example, processor (CPU) 1200, as shown in FIG. 18. A processing circuit also includes devices such as an application specific integrated circuit (ASIC) and conventional circuit components arranged to perform the recited functions.

In FIG. 18, the processing circuitry 130 includes a CPU 1200 which performs the processes described above. The processing circuitry 130 may be a general-purpose computer or a particular, special-purpose machine.

Alternatively, or additionally, the CPU 1200 may be implemented on an FPGA, ASIC, PLD or using discrete logic circuits, as one of ordinary skill in the art would recognize. Further, CPU 1200 may be implemented as multiple processors cooperatively working in parallel to perform the instructions of the inventive processes described above.

The processing circuitry 130 in FIG. 18 also includes a network controller 1206, such as an Intel Ethernet PRO network interface card from Intel Corporation of America, for interfacing with network 1228. As can be appreciated, the network 1228 can be a public network, such as the Internet, or a private network such as an LAN or WAN network, or any combination thereof and can also include PSTN or ISDN sub-networks. The network 1228 can also be wired, such as an Ethernet network, or can be wireless such as a cellular network including EDGE, 3G and 4G wireless cellular systems. The wireless network can also be Wi-Fi, Bluetooth, or any other wireless form of communication that is known.

The processing circuitry 130 further includes a display controller 1208, such as a graphics card or graphics adaptor for interfacing with display 1210, such as a monitor. A general purpose I/O interface 1212 interfaces with a keyboard and/or mouse 1214 as well as a touch screen panel 1216 on or separate from display 1210. General purpose I/O interface also connects to a variety of peripherals 1218 including printers and scanners.

The general-purpose storage controller 1224 connects the storage medium disk 1204 with communication bus 1226, which may be an ISA, EISA, VESA, PCI, or similar, for interconnecting all of the components of the processing circuitry 130. A description of the general features and functionality of the display 1210, keyboard and/or mouse 1214, as well as the display controller 1208, storage controller 1224, network controller 1206, sound controller 1220, and general purpose I/O interface 1212 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset.

The functions and features described herein may also be executed by various distributed components of a system. For example, one or more processors may execute these system functions, wherein the processors are distributed across multiple components communicating in a network. The distributed components may include one or more client and server machines, which may share processing, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

Having now described embodiments of the disclosed subject matter, it should be apparent to those skilled in the art that the foregoing is merely illustrative and not limiting, having been presented by way of example only. Thus, although particular configurations have been discussed herein, other configurations can also be employed. Numerous modifications and other embodiments (e.g., combinations, rearrangements, etc.) are enabled by the present disclosure and are within the scope of one of ordinary skill in the art and are contemplated as falling within the scope of the disclosed subject matter and any equivalents thereto. Features of the disclosed embodiments can be combined, rearranged, omitted, etc., within the scope of the invention to produce additional embodiments. Furthermore, certain features may sometimes be used to advantage without a corresponding use of other features. Accordingly, Applicant(s) intend(s) to embrace all such alternatives, modifications, equivalents, and variations that are within the spirit and scope of the disclosed subject matter.

The exemplary embodiments according to the present disclosure have been described by way of example, and various changes may be made without departing from the scope and spirit of the present disclosure. The exemplary embodiments disclosed above are thus not restrictive, and the true scope and spirit of the present disclosure are defined by the appended claims.

REFERENCE SIGNS LIST

1 Plasma processing apparatus
10 Chamber
W Substrate
SF Silicon-containing film
What is claimed is:
1. An etching method, comprising:
providing a substrate in a chamber included in a plasma processing apparatus, the substrate including a silicon-containing film, the silicon-containing film not being a silicon film, and a mask on the silicon-containing film, the mask containing a metal;

supplying a process gas via a controllable gas supply, the process gas includes a first gas having a halogen component supplied at a first flow rate and a second gas having a phosphorus component supplied at a second flow rate, the second gas including $PCl_5$, $POCl_3$, $PBr_3$, or $PBr_5$ and the first flow rate being different than the second flow rate; and etching the silicon-containing film through the mask with a plasma generated from the process gas supplied to the chamber and forming a recess in the silicon-containing film, wherein the etching includes forming a phosphorus-oxygen bond on a surface of the mask.

2. The etching method according to claim 1, wherein the silicon-containing film includes a silicon oxide film.

3. The etching method according to claim 2, wherein the silicon-containing film further includes at least one film selected from the group consisting of a silicon nitride film, a polycrystalline silicon film, a carbon-containing silicon film, and a low dielectric constant film.

4. The etching method according to claim 1, wherein the mask includes a first portion with a higher proportion of mask material than openings defined in the mask on the silicon-containing film and a second portion with a lower proportion of mask material than the openings.

5. The etching method according to claim 4, wherein the mask has a line-and-space pattern.

6. The etching method according to claim 1, further comprising:

forming a protective film on a surface of a side wall defining a recess formed by the etching, wherein the protective film contains phosphorous from the phosphorus component of the process gas.

7. The etching method according to claim 6, wherein the etching and the forming are performed at a same time.

8. The etching method according to claim 6, wherein the protective film contains at least one of another phosphorus-oxygen bond or a phosphorus-silicon bond.

9. The etching method according to claim 1, wherein the process gas contains a fluorine-containing gas.

10. The etching method according to claim 1, wherein the process gas further contains a hydrocarbon, a hydrofluorocarbon, or a fluorocarbon.

11. The etching method according to claim 1, wherein the etching includes periodically applying a pulse wave including a pulsed electrical bias to a substrate support that supports the substrate.

12. The etching method according to claim 11, wherein the pulsed electrical bias includes radio-frequency power at a power level of 2 kW or more.

13. The etching method according to claim 1, wherein the phosphorus component of the second gas does not include chlorine.

14. The etching method according to claim 1, wherein:
the metal includes titanium nitride, tungsten, or tungsten nitride, and
the first gas includes $C_2F_6$, $C_3F_6$, $C_3F_8$, $C_5F_8$, or $CH_3F$.

15. An etching method, comprising:
providing a substrate in a chamber included in a plasma processing apparatus, the substrate including a silicon-containing film, the silicon-containing film not being a silicon film, and a mask on the silicon-containing film, the mask containing a metal;

supplying a process gas via a controllable gas supply, the process gas includes a first gas having a halogen component supplied at a first flow rate and a second gas having a phosphorus component supplied at a second flow rate, the second gas including $PCl_5$, $POCl_3$, $PBr_3$, or $PBr_5$ and the first flow rate being different than the second flow rate; and etching the silicon-containing film with a plasma generated from the process gas supplied to the chamber, wherein the etching includes forming a phosphorus-oxygen bond on a surface of the mask, wherein the etching includes periodically applying a pulse wave including a pulsed electrical bias to a substrate support that supports the substrate, and the pulse wave has a period defined by a frequency ranging from 1 Hz to 100 kHz inclusive.

16. The etching method according to claim 15, wherein the periodic applying includes applying the pulsed electrical bias to the substrate support for a duration ranging from 50% to 99% inclusive of a length of a period of the pulse wave.

17. The etching method according to claim 15, further comprising
setting the substrate to a temperature lower than or equal to 0° C. at a start of the etching.

18. The etching method according to claim 15, wherein the phosphorus component of the second gas does not include chlorine.

19. The etching method according to claim 15, wherein:
the metal includes titanium nitride, tungsten, or tungsten nitride, and
the first gas includes $C_2F_6$, $C_3F_6$, $C_3F_8$, $C_5F_8$, or $CH_3F$.

* * * * *